United States Patent [19]

Kerzman et al.

[11] Patent Number: 5,724,250
[45] Date of Patent: Mar. 3, 1998

[54] METHOD AND APPARATUS FOR PERFORMING DRIVE STRENGTH ADJUST OPTIMIZATION IN A CIRCUIT DESIGN

[75] Inventors: Joseph P. Kerzman, New Brighton; Kenneth L. Engelbrecht, Blaine; Robert J. Palermo, Shoreview; Douglas A. Fuller, Eagan, all of Minn.

[73] Assignee: Unisys Corporation, Blue Bell, Pa.

[21] Appl. No.: 598,506

[22] Filed: Feb. 7, 1996

[51] Int. Cl.$^6$ .................................................. G06F 17/50
[52] U.S. Cl. ........................................ 364/488; 364/489
[58] Field of Search ........................... 364/488, 489, 364/490, 491, 468.28, 578

[56] References Cited

U.S. PATENT DOCUMENTS

| | | | |
|---|---|---|---|
| 4,827,428 | 5/1989 | Dunlop et al. | 364/491 |
| 5,077,676 | 12/1991 | Johnson et al. | 364/489 |
| 5,111,413 | 5/1992 | Lazansky et al. | 364/578 |
| 5,426,591 | 6/1995 | Ginetti et al. | 364/489 |
| 5,459,673 | 10/1995 | Carmean et al. | 364/489 |
| 5,490,268 | 2/1996 | Matsunaga | 395/550 |
| 5,568,395 | 10/1996 | Huang | 364/489 |
| 5,619,418 | 4/1997 | Blaauw et al. | 364/489 |
| 5,623,418 | 4/1997 | Rostoker et al. | 364/489 |
| 5,638,294 | 6/1997 | Sasada | 364/491 |

OTHER PUBLICATIONS

Tufte, "CML III Bipolar Standard Cell Library", Proceedings of the 1988 Bipolar Circuits and Technology Meeting, Minneapolis, Minnesota, Sep., 198, pp. 180–182.

*Primary Examiner*—Kevin J. Teska
*Assistant Examiner*—Leigh Marie Garbowski
*Attorney, Agent, or Firm*—Nawrocki, Rooney & Sivertson, P.A.

[57] ABSTRACT

A method and apparatus for efficiently optimizing a circuit design by substituting identified cells within the circuit design with logically equivalent cells having different drive strengths. The present invention eliminates the need to update the design database and to place and route the circuit design during each design iteration. Rather, an improved extraction tool is provided which incorporates a cell substitution list, and updates the RC file therefrom. The updated RC file is used by the timing analysis tool to determine if the updated design will meet the design specification. After the design meets the design specification, a final place and route may be performed.

45 Claims, 9 Drawing Sheets

METHOD AND APPARATUS FOR PERFORMING DRIVE STRENGTH ADJUST OPTIMIZATION IN A CIRCUIT DESIGN

CROSS REFERENCE TO CO-PENDING APPLICATIONS

The present application is related to U.S. patent application Ser. No. 08/597,847, filed Feb. 7, 1996, entitled Method and Apparatus for performing Timing Analysis on a Circuit Design, U.S. patent application Ser. No. 08/597,931, filed Feb. 7, 1996, entitled Method and Apparatus for resolving conflicts between cell solution, recommendations provided by a drive strength adjust tool, and U.S. patent application Ser. No. 08/789,029, filed Jan. 27, 1997, entitled Method and Apparatus for using a placement tool to manipulate cell solution list, which are all assigned to the assignee of the present invention and are all hereby incorporated by reference.

BACKGROUND OF THE INVENTION

1. Field of the Invention

The present invention generally relates to the optimization of circuit designs and more particularly relates to performing drive strength adjustments to components within such circuit designs.

2. Description of the Prior Art

The advancement of integrated circuit, printed circuit board and other related technologies is advancing at a very rapid rate. The latest generation of integrated circuits can incorporate over four times the circuitry than was possible just a few years ago. Further, circuit board and multi-chip module technology has allowed much denser circuit board designs. These and other developments have allowed the development of increasingly complex and high speed computer systems.

The design of such computer systems has become increasingly difficult and time consuming. To maximize performance and minimize the size and power of such computer system, designers often implement much of the hardware in a number of integrated circuits. For maximum performance, the integrated circuits are often custom or semi-custom designed. Each integrated circuit may contain several hundred thousand gates, and each gate must be placed and routed in accordance with the overall computer system specification, all on a die typically measuring less than 625 mils on a side.

To design such a computer system, the designer typically produces an overall system specification. The overall system specification typically defines the overall function of the computer system, including the power and timing requirements thereof. Because of the size and complexity of such computer systems, system designers often partition the overall design into a number of blocks, wherein each of the blocks performs a dedicated function. Partitioning is typically continued until the size of each of the sub-blocks is of a manageable size. A specification for each of the sub-blocks is then written to define the function, timing and power requirements thereof. Often, one or more of the sub-blocks are implemented in an integrated circuit.

After the sub-block specifications have been defined, logic designers typically enter a schematic into a design database for each sub-block, using selected components from a component library. The schematic is typically entered via a database editor on an engineering workstation, and the design database is typically stored therein.

The component library may include a number of cells wherein each of the cells implements a different function. For example, the component library may include NAND gates, NOR gates, XOR gates, registers, latches, I/O cells, etc. Further, each of the individual cells may have a logically equivalent component with a different drive strength. The desirability of having different drive strength cells within the component library is discussed in more detail below.

In addition to the above, each of the cells typically have a number of "representations" stored in the component library. For example, a cell may have a "symbolic representation", a "schematic representation", and a "physical representation". When entering the schematic, the designer typically provide the "symbolic representation" directly on the schematic sheet via the database editor, and interconnects the symbols to achieve the desired function.

After the schematic has been entered into the design database, the schematic may be processed, or expanded, into a design netlist. The design netlist typically identifies each of the library cells that are used in the schematic, and further identifies the interconnections therebetween. The netlist is often written in an EDIF (Electronic Design Interface Format) format. The EDIF format is an industry wide standard, developed to allow the design netlist to be compatible with various software programs developed by different vendors.

An alternative approach for entering the design into a design database involves using sophisticated synthesis tools. The word "tool" as used herein refers to a software program running on a data processing system. In such an approach, the designer enters logical equations describing the function of the design. A first synthesis tool implements the logical equations using logical cells from the component library. A second synthesis tool may then minimizes the logic using known techniques, and may attempt to optimize the design based on a number of predetermined factors. For example, the designer may direct the synthesis tool to optimize the design for speed, power, or some other factor.

Typically, the resulting design netlist is provided to a place and route tool. There are a number of place and route tools available on the market today. The place and route tool may read the "physical representation" of each cell within the design and place the physical representation within an imaginary two dimensional box. For integrated circuit designs, the imaginary box often corresponds to the outer periphery of the resulting integrated circuit die. Once all of the cells have been placed, the place and route tool interconnects the cells in accordance with the design netlist. Depending on the technology and the power bussing strategy of the component library, the place and route tool may provide the required interconnections (or routes) using up to five layers of metal.

Initially, the place and route tool may not take into account critical timing paths or other design parameters. However, as discussed below, most modern place and route tools have the capability of biasing the placement and routing of the cells to favor predetermined nets within the design database.

In some cases, it is advantageous to manually place certain critical cells within the design. The critical cells are often larger macrocells such as ALU's, RAMs, ROMs, or other macro blocks. The manual placement of these cells is typically accomplished via a floor-planning tool. Stand alone floor-planning tools are available. However, many place and route tools have at least a limited floor-planning capability. After the critical cells are manually placed by the designer, the remaining cells may be placed and the circuit design may be routed as described above.

The output of the place and route tools is typically a netlist in the EDIF format. In most large designs, the place and route netlist is hierarchical in nature. Thus, the place and route netlist typically only identifies the placement coordinates and orientation of each of the cells within the design, and does not contain the actual physical representation of each cell. Rather, the place and route netlist contains pointers to the physical representations stored in the component library. Thus, if a particular cell is used a number of times within the design, only one copy of the physical representation is required to be stored. The place and route netlist typically also identifies the interconnections, or routes, by the coordinates of the starting, ending, and any other points where the route changes direction. Further, the width of the route is also identified.

After the place and route netlist is generated, the designer may use an extraction tool to extract an RC file therefrom. The extraction tool may process the place and route netlist and may determine the resistance, capacitance, or any other parameters selected by the designer, for each net in the design. For example, the extraction tool may determined the capacitance of a particular net by calculating the input load capacitance for each gate connected to the net, and may further determine the capacitance between a corresponding route and any other layer within the design, including the substrate. That is, the extraction tool may determine what layers the particular route overlaps, and may calculate the capacitance generated therebetween.

To provide accurate results, the extraction tool is often provided with technology specific parameters including oxide thicknesses between metal layers, the permittivity of each of the oxide layers, etc. These technology specific parameters are often stored in a technology file, which may be read by the extraction tool.

After the extraction tool provides an RC file for the design, the RC file and the original netlist may be provided to a timing analysis tool. The timing analysis tool processes the netlist and the RC file to determine the timing of predetermined circuit paths within the design. Part of the pre-processing performed by the timing analysis tool is to read the timing information from the component library for each of the cells used in the design. For example, the timing information stored in the component library may include parameters such as a base delay, and delay per unit of capacitance. The timing analysis tool may use the timing information, along with the RC file to determine the delay for each cell within the design. Thereafter, the timing analysis tool identifies predetermined timing paths within the design, and adds the delay for each of the cells to determine an overall path delay for each timing path. The timing analysis tool may then report all timing paths that have an overall path delay that falls outside of a predetermined timing specification.

Timing analysis tools typically use a path enumeration algorithm or a critical path algorithm. The path enumeration algorithm identifies all timing paths within the design, and calculates the overall delay therefor. Thus, the path enumeration algorithm calculates the overall delay for timing paths that are well within the timing specification. In contrast, the critical path algorithm only identifies the worst case paths between registers, and calculates the overall delay therefor. The advantage of the path enumeration algorithm is that all timing paths that fall outside of the predetermined specification can be identified in a single run. However, for large designs, this may require a prohibitively long run time. The advantage of the critical path algorithm is that the run times may be relatively short, but more iterations may be required to identify all of the timing paths the fall outside of the timing specification.

Regardless of which timing analysis algorithm is used, the timing analysis tool may determine if any timing violations exist. If no timing violations exist, the design is deemed to meet the predefined timing specification. If however, the timing analysis tool identifies timing violations, the designer must evaluate each timing violation, and provide corrections to the design database to overcome such timing violations. For large designs having many timing violations, this may be prohibitively time consuming.

An approach to aid the designer in evaluating and correcting the timing violations identified by the timing analysis tool is suggested in an article entitled "CML III Bipolar Standard Cell Library", by Brian N. Tufte (Proceedings of the 1988 Bipolar Circuits Conference, Minneapolis, Minn., 1988). Tufte suggests using a software tool called SPEN (Speed Power Enhancement Program) to identify cells within the design that could be replaced by a higher power cell to reduce the delay of the corresponding timing path.

After cells have been identified for substitution, the designer may make the desired changes to the original design database. This may be accomplished by manually manipulating the design database using a database editor, or by manually creating a script to direct the database editor to make such changes. Alternatively, and depending on the how the database was originally entered, the designer may manually modify the synthesized database by substituting the selected higher power cells therein.

In either case, the design database is either expanded or synthesized to provide an updated design netlist incorporating the substituted cells, which may be provided to the place and route tool. The updated design may then be placed and routed. The process of placing and routing the design, extracting an RC file, performing timing analysis, identifying cells for substitution, and updating the design database may be repeated until the design falls within the timing specification.

A limitation of the above referenced design process is that each iteration may take an unacceptable amount of time to complete. A substantial portion of the above referenced design cycle may be consumed by the expansion or synthesis of the design database, and by the placing and routing the design netlist. It would thus be advantageous to eliminate these steps from subsequent design iterations.

SUMMARY OF THE INVENTION

The present invention overcomes many of the disadvantages of the prior art by providing a method and apparatus for efficiently designing complex high speed circuits. The present invention recognizes that the placement and routing of the design does not significantly change, particularly when only cell substitutions are made to the design database. Thus, it is recognized that it is not necessary to repeat the synthesis step or the place and route step during each design iteration, as taught by the prior art. Rather, an improved extraction tool is provided which incorporates the recommended cell substitutions by updating only the RC file. The updated RC file may then be used by the timing analysis tool to determine if the updated design will meet the design specification. After the design meets the design specification, the recommended cell substitution can be made, and a final place and route may be performed.

As can readily be seen, the present invention eliminates the need to synthesize, and to place and route the design during each design iteration, and thus may significantly reduce the time required to complete a design cycle. This may significantly reduce the cost of designing a circuit, and may improve the time to market therefor.

In a first exemplary embodiment of the present invention, a system for correcting timing violations in a circuit design is provided. The circuit design is represented in a circuit design database including a number of components selected from a component library. Selected components of the component library may have at least one corresponding logically equivalent component with a different drive strength. The exemplary embodiment may include an input means for inputting the circuit design database into the system. For purposes of this embodiment, it is assumed that the circuit design database has been placed and routed using a place and route tool. An RC file may then be extracted from the circuit design database, wherein the RC file may contain entries that represent the electrical loading on selected nets within the circuit design.

A timing analysis means may also be provided for analyzing a number of timing paths within the circuit design. The timing analysis means calculates the delay of selected components along each of the number of timing paths and sums the delays of the selected components. To determine if any of the timing paths fall outside of a predefined specification, the exemplary embodiment may include a comparing means coupled to the analyzing means for comparing the delay along a selected timing path with a predefined specification.

To mitigate any timing violations that may exist, a drive strength adjust means may be provided for substituting selected components along selected timing paths with a corresponding logically equivalent component having a different drive strength. Finally, an executing means may be provided for executing the extracting means, the analyzing means, the comparing means, and the drive strength adjust means for a predetermined number of iterations, or until the design meets the predefined timing specification.

It is contemplated that the drive strength adjust means may determine which of the cells within the design to substitute for a logically equivalent component having a different drive strength. In a preferred embodiment, this may be accomplished by identifying a number of timing paths wherein each of the timing path including a source latch, a destination latch, and a number of components connected therebetween. The drive strength adjust means may identify the number of components that are in each of the number of timing paths, and the order thereof.

The drive strength adjust means may then substitute a first one of the number of components with a corresponding logically equivalent component with a different drive strength, and may determine the delay of the timing path. Then, the drive strength adjust means may substitute the first one of the number of components with a corresponding logically equivalent component having yet another drive strength, and may determine the delay of the timing path. The drive strength adjust means may then determine which cell substitution provided the optimum delay. This process may be repeated until all logically equivalent components having different drive strengths are substituted for the first one of the number of components. The drive strength adjust means may then select the logically equivalent component that produces the optimum delay for the timing path. This process may be continued for each of the components within the timing path, thereby resulting in an overall optimum delay for the timing path. The drive strength adjust means may output a list of the selected components and the suggested drive strength therefor.

It is contemplated that the cells to be substituted may be recorded in an accumulated cell substitution list during each of the number of iteration. The accumulated cell substitution list may then be merged with a base cell substitution list thereby resulting in an updated base cell substitution list. The updated base cell substitution list may be provided to the extracting means, wherein an updated RC file may be generated and provided to the timing analysis means for the next design iteration.

It is further contemplated that the merging means may resolve any conflict between the accumulated cell substitution list and the base cell substitution list. An example of when a conflict may arise is when a particular cell is identified in more than one timing path during different design iterations. That is, the base cell substitution list may identify a particular cell within a first timing path and may indicate that the particular cell is to be substituted with a logically equivalent cell having a first drive strength. The accumulated cell substitution list, and during the current design iteration, may also identify the same cell within a second timing path and may indicate that the particular cell is to be substituted with a logically equivalent cell having a second drive strength. It is contemplated that the present invention may resolve this and other conflicts. In a preferred embodiment, the conflict is resolved based upon a predetermined priority scheme. Further details of the preferred priority scheme may be found in the above referenced U.S. patent application Ser. No. 08/597,931, which is incorporated herein by reference.

In addition to the above, it is contemplated that the exemplary embodiment may perform physical checks of the circuit design and indicate any physical check violations therein. A second drive strength adjust means may be provided for selecting cells to be substituted with a corresponding logically equivalent component having a different drive strength to mitigate any physical check violations. The physical checks tool may report a violation if, for example, the capacitance on a route exceeds a maximum capacitance value, the cross-talk between two routes exceeds a maximum cross-talk value, etc.

It is contemplated that the cells selected by the second drive strength adjust means may be recorded in a physical checks substitution list. After the above described timing violation design iterations are complete, and the design meets the predetermined timing specification, a second merging means may merge the final base cell substitution list with the physical checks substitution list. It is contemplated that the second merging means may resolve any conflict between the final base cell substitution list and the physical checks substitution list.

An example of when a conflict may arise during this second merging step is when a particular cell is identified both by the physical checks drive strength adjust tool and the timing analysis drive strength adjust tool. That is, the base cell substitution list may indicate that a particular cell is to be substituted with a logically equivalent cell having a first drive strength to correct a timing violation. The physical checks drive strength adjust tool may also identify the same cell and may indicate that the particular cell is to be substituted with a logically equivalent cell having a second drive strength to correct a physical checks violation. It is contemplated that the present invention may resolve these and other conflicts. In a preferred embodiment, the conflict is resolved using a predetermined priority scheme. Further details of the preferred priority scheme may be found in the above referenced U.S. patent application Ser. No. 08/597, 931, which is incorporated herein by reference.

After all conflicts are resolved, the second merging means may provide a final cell substitution list. In a preferred embodiment, the final cell substitution list is provided to a manual placement tool, or floor-planning tool. The manual placement tool may have an interface for reading the final substitution list and make the substitutions indicated therein to the design database. A further description of the interface for importing the final cell substitution list into a manual placement tool can be found in the above referenced U.S. patent application Ser. No. 08/789,029, which has been incorporated herein by reference.

The output of the manual placement tool may then be provided to the place and route tool for final placement and routing. It is recommended that the resulting design database be run through the timing analysis tool and the physical checks tool to verify that the final design meets the predetermined specification.

Finally, it is contemplated that the drive strength adjust means may be used to reduce the power consumption of a circuit design. That is, the drive strength adjust means may identify particular timing paths within the design that have excess margin with respect to the timing and/or physical specification. Under such circumstances, the drive strength adjust means may substitute selected components along these timing paths with a corresponding logically equivalent component having a lower drive strength to reduce the power consumption of the circuit design.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
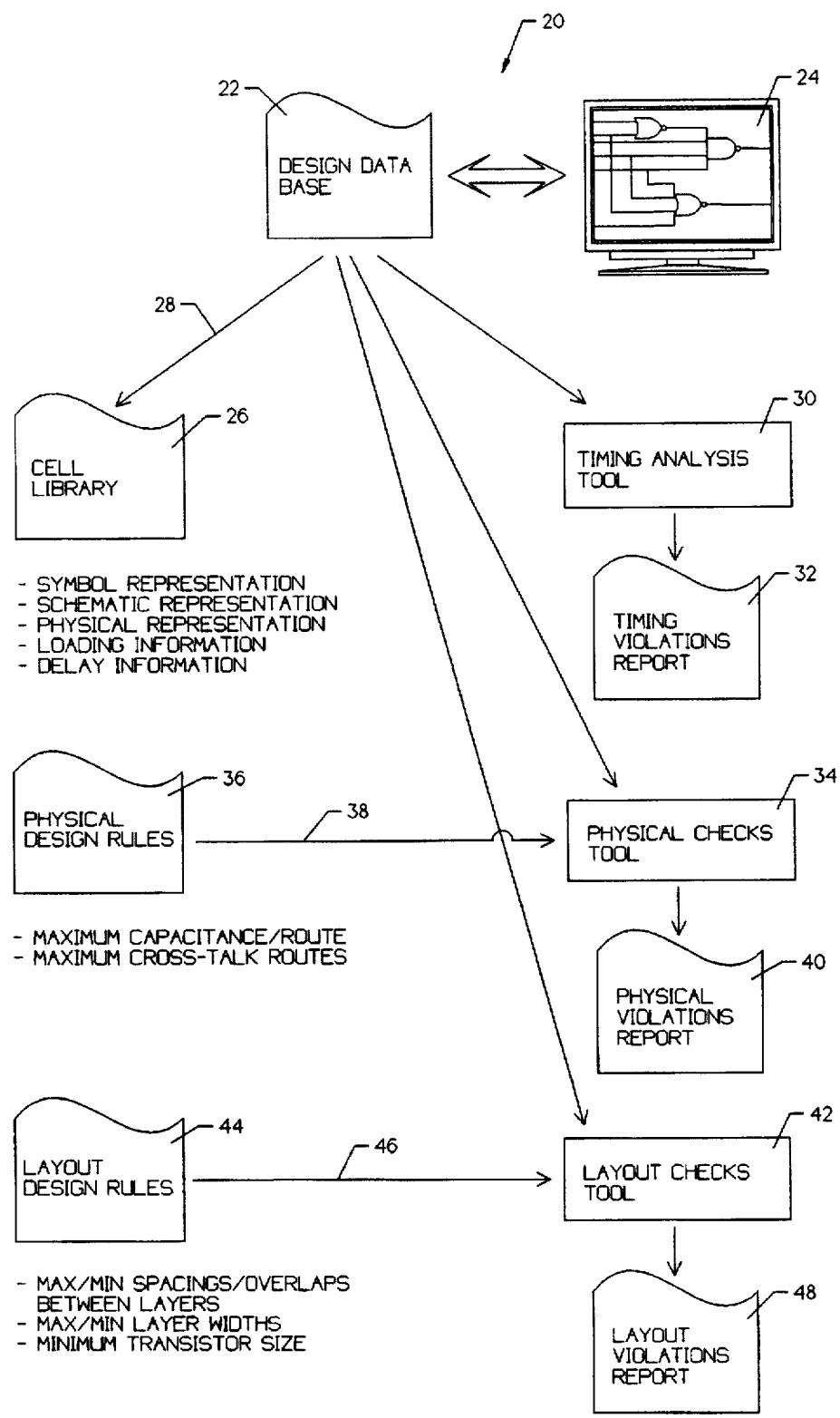
FIG. 1 is a block diagram showing a design database, a cell library and various software tools used to verify the design database.
Figure 2A:
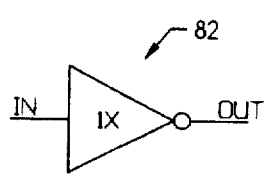
FIG. 2 is a block diagram showing typical cell representations for two logically equivalent cells having different drive strengths.
Figure 2B:
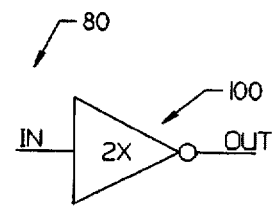
Figure 2C:
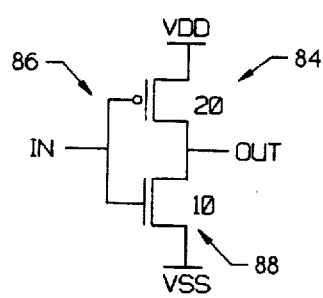
Figure 2D:
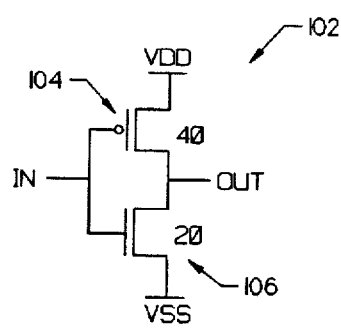
Figure 2E:
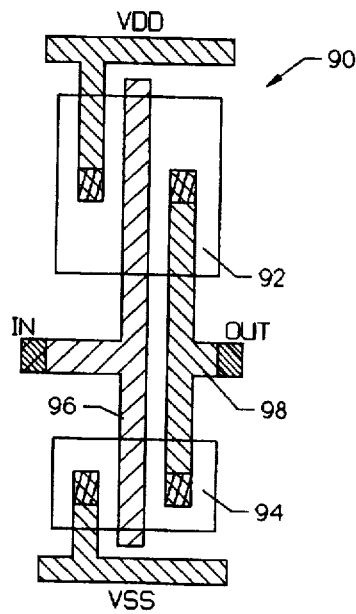
Figure 2F:
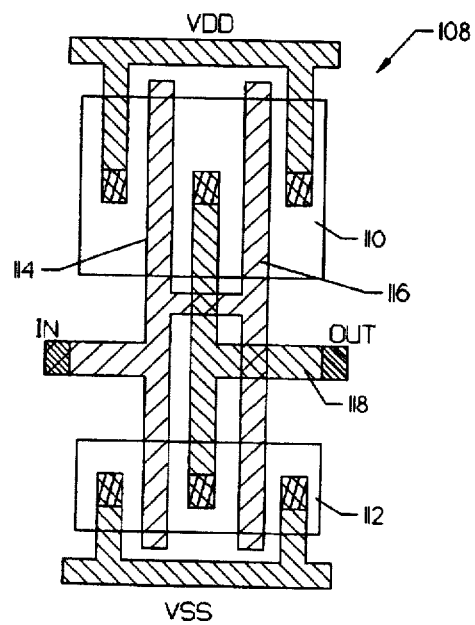

FIG. 1 is a block diagram showing a design database, a component library and various software tools used to verify that the design database meets predefined specifications. The diagram is generally shown at 20. A typical design data base is shown at 22.

Initially, a functional description of the desired circuit is input into the design database 22. This may be accomplished in a number of ways, but typically logic designers enter a schematic using selected components from a component library 26. The schematic is typically entered via a database editor on an engineering workstation as shown at 24.

The component library 26 may include a number of cells wherein each of the cells implements a different function. For example, the component library may include NAND gates, NOR gates, XOR gates, registers, latches, I/O cells, etc. Further, each of the individual cells may have a logically equivalent component with a different drive strength (see FIG. 2). The desirability of having different drive strength cells within the component library is discussed in more detail below.

In addition to the above, each of the cells typically have a number of "representations" stored in the component library 26. For example, a cell may have a "symbolic representation", a "schematic representation", and a "physical representation". When entering the schematic, the designer typically provide the "symbolic representation" directly on the schematic sheet via the database editor as shown at 24, and interconnects the symbols to achieve the desired function.

After the schematic has been entered into the design database 22, the schematic may be processed, or expanded, into a design netlist. The design netlist typically identifies each of the library cells that are used in the schematic, and further identifies the interconnections therebetween. The netlist is often written in an EDIF (Electronic Design Interface Format) format. The EDIF format is an industry wide standard, developed to allow the design netlist to be compatible with various software programs developed by different vendors.

An alternative approach to entering the design into the design database 22 involves using sophisticated synthesis tools (not shown). In such an approach, the designer enters logical equations describing the function of the design. A first synthesis tool implements the logical equations using logical cells from the component library 26. A second synthesis tool may then minimizes the logic using known techniques, and may attempt to optimize the design based on a number of predetermined factors. For example, the designer may direct the synthesis tool to optimize the design for speed, power, or some other factor.

Typically, the resulting design netlist is provided to a place and route tool (not shown). There are a number of place and route tools available on the market today. The place and route tool may read the "physical representation" of each cell within the design and place the physical representation within an imaginary two dimensional box. For integrated circuit designs, the imaginary box often corresponds to the outer periphery of the resulting integrated circuit die. Once all of the cells have been placed, the place and route tool interconnects the cells in accordance with the design netlist. Depending on the technology and the power bussing strategy of the component library, the place and route tool may provide the required interconnections (or routes) using up to five layers of metal.

The output of the place and route tool is stored in the design database 22. In most large designs, the place and route netlist is hierarchical in nature. Thus, the place and route netlist typically only identifies the placement coordinates and orientation of each of the cells within the design, and does not contain the actual physical representation of each cell. Rather, the place and route netlist contains pointers 28 to the physical representations stored in the component library 26. Thus, if a particular cell is used a number of times within the design, only one copy of the physical representation is required to be stored. The place and route netlist typically also identifies the interconnections, or routes, by the coordinates of the starting, ending, and any other points where the route changes direction. Further, the width of the route is also identified.

After the place and route netlist is generated, the designer may use an extraction tool (not shown) to extract an RC file therefrom. The extraction tool may process the place and route netlist and may determine the resistance, capacitance, or any other parameters selected by the designer, for each net in the design. For example, the extraction tool may determined the capacitance of a particular net by calculating the input load capacitance for each gate connected to the net, and may further determine the capacitance between a corresponding route and any other layer within the design, including the substrate. That is, the extraction tool may determine what layers the particular route overlaps, and may calculate the capacitance generated therebetween.

To provide accurate results, the extraction tool is often provided with technology specific parameters including oxide thicknesses between metal layers, the permittivity of each of the oxide layers, etc. These technology specific parameters are often stored in a technology file (not shown), which may be read by the extraction tool.

After the extraction tool provides an RC file for the design, the RC file and the original netlist may be provided to a timing analysis tool 30. The timing analysis tool 30 processes the netlist and the RC file to determine the timing of predetermined circuit paths within the design. Part of the pre-processing performed by the timing analysis tool 30 is to read the timing information from the component library 26 for each of the cells used in the design. For example, the timing information stored in the component library 26 may include parameters such as a base delay, and delay per unit of capacitance. The timing analysis tool 30 may use the timing information, along with the RC file to determine the delay for each cell within the design. Thereafter, the timing analysis tool 30 may identify predetermined timing paths within the design, and add the delay for each of the cells to determine an overall path delay for each timing path. The timing analysis tool 30 may then report all timing paths that have an overall path delay that falls outside of a predetermined timing specification, as shown at 32. The timing analysis tool 30 may also determine if setup and hold times are met.

If no timing violations exist, the design is deemed to meet the predefined timing specification. If, however, the timing analysis tool 30 identifies timing violations, the designer must evaluate each timing violation, and provide corrections to the design database 22 to overcome such timing violations.

The design database 22 may also be provided to a physical checks tool 34. The physical checks tool 34 may read predefined physical design rules 36. The physical design rules may include parameters such as maximum load/net, maximum cross-talk between nets, etc. The physical checks tool 34 may perform these physical checks on the design database 22, and may report any violations as shown at 40.

Finally, the design database 22 may be provided to a layout checks tool 42. The layout checks tool 42 may read predefined layout design rules. The layout design rules 44 may include parameters such as maximum and minimum spacings and overlaps between layers, maximum and minimum layer widths, etc. The layout design rules are dictated by the particular processing technology used, and may help ensure that the resulting design can be manufactured with acceptable yields. The layout checks tool 42 may report any violations as shown at 48.

FIG. 2 is a block diagram showing typical cell representations for two logically equivalent cells having different drive strengths. The diagram is generally shown at 80. As indicated above, each of the cells in a component library 26 typically have a number of "representations" stored therein. For example, a cell may have a "symbolic representation", a "schematic representation", and a "physical representation". The symbolic representation is often used for schematic entry. The schematic representation is often used by circuit simulation programs such as SPICE, and a number of others tools. The physical representation is used by the extraction tool, the place and route tool, the physical checks tool 34, the layout checks tool, and a number of other tools.

Each of the individual cells may also have a logically equivalent component with a different drive strength. The desirability of having different drive strength cells within the component library is discussed in more detail below. FIG. 2 shows exemplary representations for a "1X" inverter and a "2X" inverter, wherein the "1X" and "2X" designations indicate the drive strength of the corresponding cell. For example, the "2X" inverter has twice the drive strength as the "1X" inverter.

The symbolic representation for the "1X" inverter is shown at 82, and the schematic representation for the "1X" inverter is shown at 84. The schematic representation 84 shows a P-Channel device 86 with a width of 20 and an N-Channel device 88 with a width of 10.

The physical representation of the "1X" inverter is generally shown at 90 and includes a number of mask layers that are used during the manufacturing of the component. For example, an N-Tub is shown at 92 and a P-Tub is shown at 94. The P-Channel transistor is created by a poly-silicon gate 96 overlapping the N-Tub 92 as shown. Similarly, the N-Channel transistor is created by the poly-silicon gate 96 overlapping the P-Tub 94 as shown.

The symbolic representation for the "2X" inverter is shown at 100, and the schematic representation for the "2X" inverter is shown at 102. The schematic representation 102 shows a P-Channel device 104 with a width of 40 and an N-Channel device 106 with a width of 20. Note that these widths are twice that of the "1X" inverter 84.

The physical representation of the "2X" inverter is generally shown at 108 and includes a number of mask layers that are used during the manufacturing of the component. For example, an N-Tub is shown at 110 and a P-Tub is shown at 112. The P-Channel device is created by poly-silicon gates 114 and 116 overlapping the N-Tub 110 as shown. Similarly, the N-Channel transistor is created by the poly-silicon gates 114 and 116 overlapping the P-Tub 112 as shown. That is, the P-channel transistor 104 essentially includes two P-channel transistors connected in parallel, each having a width of 20. Similarly, the N-channel transistor 106 essentially includes two N-channel transistors in parallel, each having a width of 10.

Figure 3:
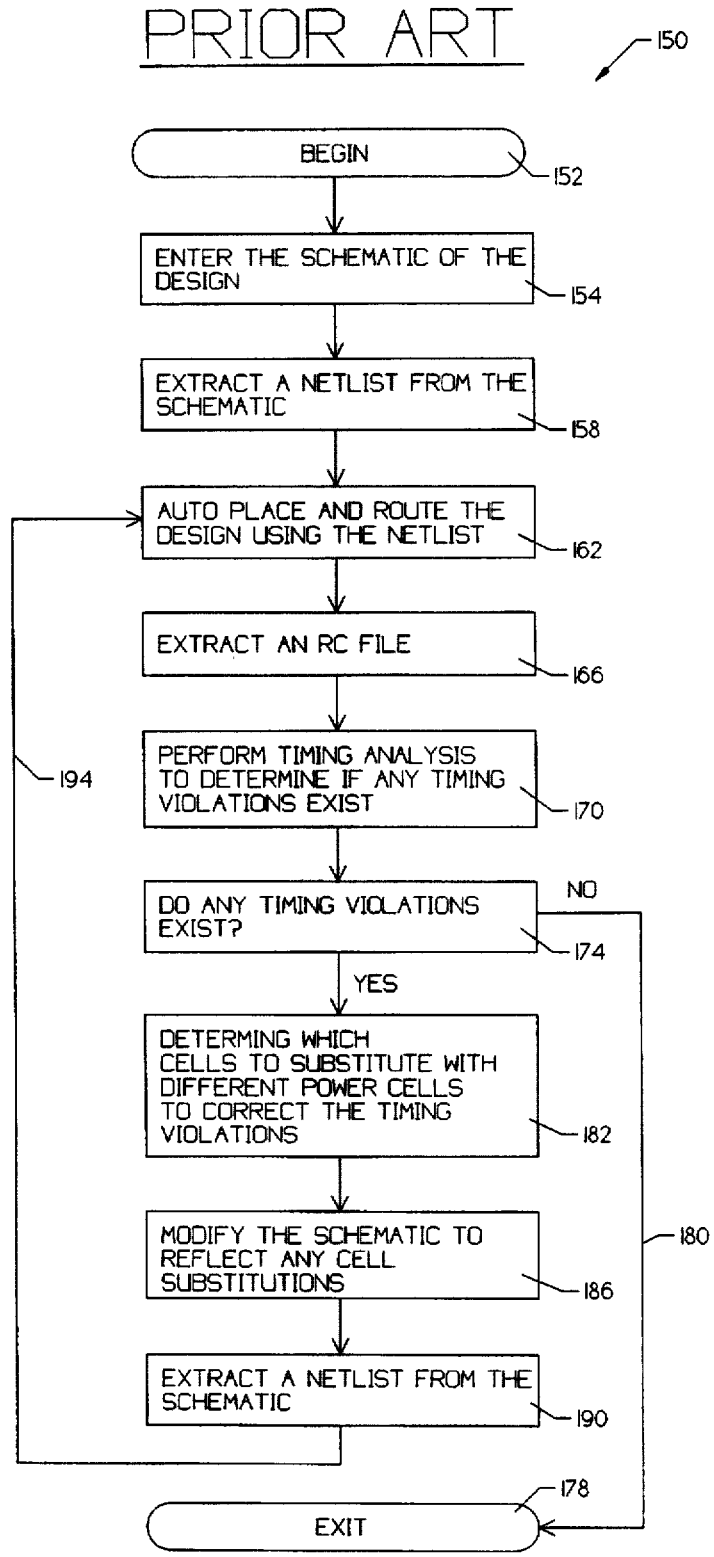
FIG. 3 is a flow diagram showing a prior art design method.

FIG. 3 is a flow diagram showing a prior art design method. The diagram is generally shown at 150. The method is entered at element 152. A logic designer may enter a schematic into a design database as shown at 154, using selected components from a component library. The schematic is typically entered via a database editor running on an engineering workstation, and the design database is typically stored therein.

After the schematic has been entered into the design database, the schematic may be processed, or expanded, into a design netlist as shown at 158. The design netlist typically identifies each of the library cells that are used in the schematic, and further identifies the interconnections therebetween. The netlist is often written in an EDIF (Electronic Design Interface Format) format. The EDIF format is an industry wide standard, developed to allow the design netlist to be compatible with various software tools developed by different vendors.

The resulting design netlist may then be provided to a place and route tool as shown at 162. There are a number of place and route tools available on the market today. The place and route tool may read the "physical representation" of each cell within the design and place the physical representation within an imaginary two dimensional box. For integrated circuit designs, the imaginary box often corresponds to the outer periphery of the resulting integrated circuit die. Once all of the cells have been placed, the place and route tool interconnects the cells in accordance with the design netlist. Depending on the technology and the power bussing strategy of the component library, the place and route tool may provide the required interconnections (or routes) using up to five layers of metal.

In most large designs, the place and route netlist is hierarchical in nature. Thus, the place and route netlist typically only identifies the placement coordinates and orientation of each of the cells within the design, and does not contain the actual physical representation of each cell. Rather, the place and route netlist contains pointers to the physical representations stored in the component library.

After the place and route netlist is generated, the designer may use an extraction tool to extract an RC file therefrom as shown at 166. The extraction tool may process the place and route netlist and may determine the resistance, capacitance, or any other parameters selected by the designer, for each net in the design. For example, the extraction tool may determined the capacitance of a particular net by calculating the input load capacitance for each gate connected to the net, and may further determine the capacitance between a corresponding route and any other layer within the design, including the substrate. That is, the extraction tool may determine what layers the particular route overlaps, and may calculate the capacitance generated therebetween.

To provide accurate results, the extraction tool is often provided with technology specific parameters including oxide thicknesses between metal layers, the permittivity of each of the oxide layers, etc. These technology specific parameters are often stored in a technology file, which may be read by the extraction tool.

After the extraction tool provides an RC file for the design, the RC file and the original design netlist may be provided to a timing analysis tool as shown at 170. The timing analysis tool processes the design netlist and the RC file to determine the timing of predetermined circuit paths within the design. Part of the pre-processing performed by the timing analysis tool is to read the timing information from the component library for each of the cells used in the design. For example, the timing information stored in the component library may include parameters such as a base delay, and delay per unit of capacitance. The timing analysis tool may use the timing information, along with the RC file to determine the delay for each cell within the design. Thereafter, the timing analysis tool identifies predetermined timing paths within the design, and adds the delay for each of the cells to determine an overall path delay for each timing path. The timing analysis tool may then report all timing paths that have an overall path delay that falls outside of a predetermined timing specification. That is, the timing analysis tool may determine if any timing violations exist.

If no timing violations exist, the design is deemed to meet the predefined timing specification and the method is exited as shown at 178 via interface 180. If however, the timing analysis tool identifies timing violations, the designer must evaluate each timing violation, and provide corrections to the design to overcome such timing violations.

An approach to aid the designer in evaluating and correcting the timing violations identified by the timing analysis tool is suggested in an article entitled "CML III Bipolar Standard Cell Library", by Brian N. Tufte (Proceedings of the 1988 Bipolar Circuits Conference, Minneapolis, Minn., 1988). Tufte suggests using a software tool called SPEN (Speed Power Enhancement Program) to identify cells within the design that could be replaced by a higher power cell to reduce the delay of the corresponding timing path.

After cells have been identified for substitution as shown at 182, the designer may make the desired changes to the original design database as shown at 186. This may be accomplished by manually manipulating the design database using a database editor, or by manually creating a script to direct the database editor to make such changes.

The design database is then expanded to provide an updated EDIF netlist incorporating the substituted cells as shown at 190, which may be provided to the place and route tool via interface 194. The updated design may then be placed and routed as shown at 162. The process of place and routing the design, extracting an RC file, performing timing analysis, identifying cells for substitution, updating the design database, and expanding the design database to provide an updated netlist may be repeated until the design falls within the design specification.

A limitation of the above referenced design process is that each iteration may take an unacceptable amount of time to complete. A substantial portion of the above referenced design cycle may be consumed by the expansion or synthesis of the design database, and the placing and routing the design. It would thus be advantageous to eliminate these steps from subsequent design iterations.

Figure 4:
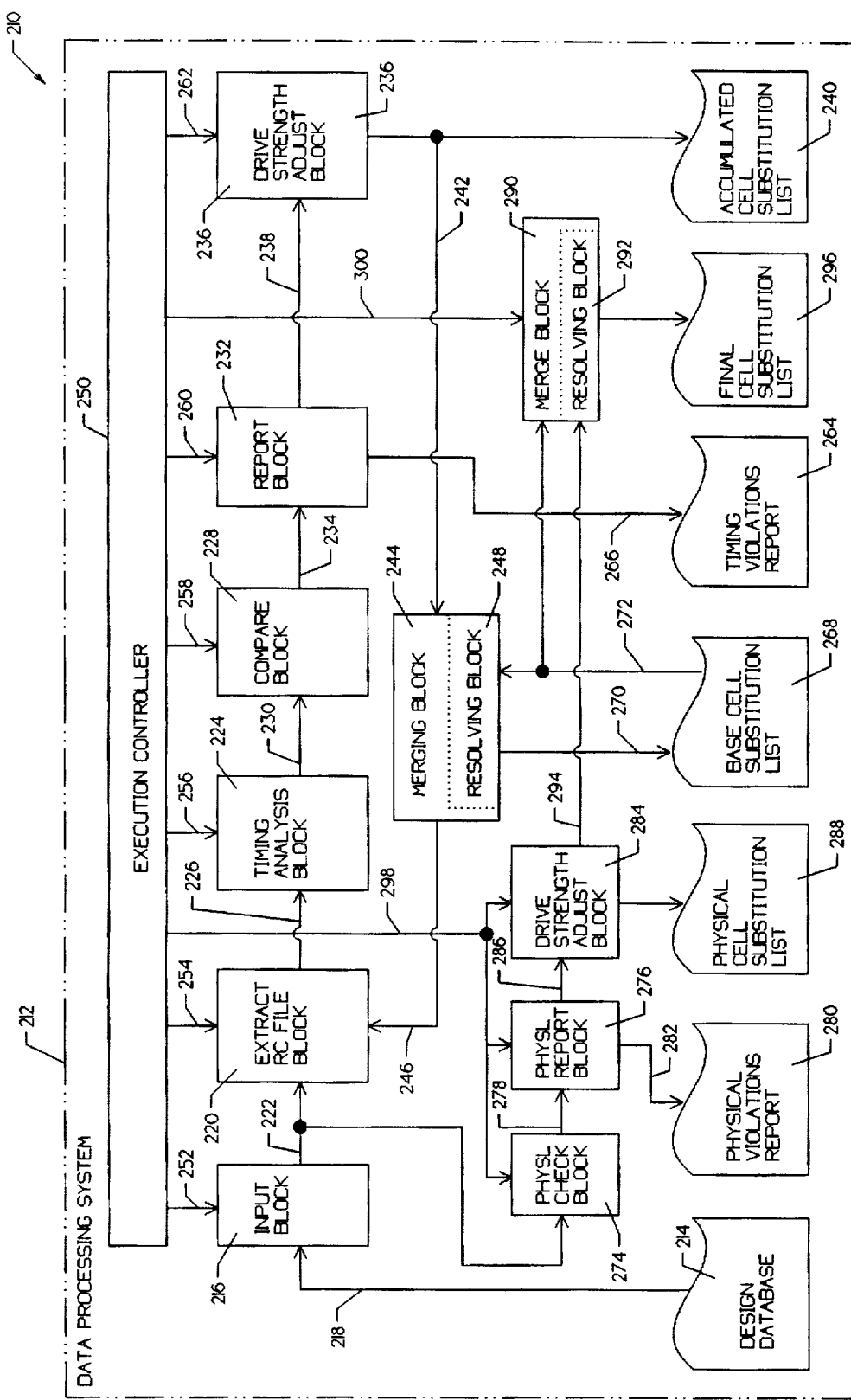
FIG. 4 is a block diagram showing a data processing system in accordance with an exemplary embodiment of the present invention.

FIG. 4 is a block diagram showing a data processing system in accordance with an exemplary embodiment of the present invention. The diagram is generally shown at 210, which includes a data processing system 212. The data processing system 212 includes a memory for storing a number of files, including design database 214. Further, the data processing system 212 includes an execution controller 250 for controlling the operation of data processing system 212.

A design database 214 is provided to a memory (not shown) located either internally or externally to data processing system 212. The memory may be a hard disk, RAM, ROM, magnetic tape or any other storage medium. It is contemplated that the design database 214 may include place and route data as described above. The design database 214 may be provided to input block 216 via interface 218. Input block 216 receives the design database 214 and provides the design database 214 to extract RC file block 220 via interface 222. Extract RC file block 220 extracts an RC file from the design database 214 as described above.

Both the design database 214 and the RC file are provided to timing analysis block 224 via interface 226.

Timing Analysis block 224 analyzes a number of timing paths within the circuit design database 214. In the exemplary embodiment, the timing analysis block 224 calculates the delay of selected components along each of the timing paths and sums the delays of the selected components. To determine if any of the timing paths fall outside of a predefined specification, the exemplary embodiment may include a compare block 228 coupled to the timing analysis block 224 via interface 230, for comparing the delay along a selected timing path with a predefined specification.

The compare block 228 may provide the result of the compare to a report block 232 via interface 234. Report block 232 may write all timing violations to a timing violations file as shown at 264. Further, report block 232 may report all timing violations to a drive strength adjust block 236 via interface 238.

To mitigate any timing violations that may exist, drive strength adjust block 236 may determine a number of selected components along the timing paths identified by the report block 232 for substitution with a corresponding logically equivalent component having a different drive strength. The drive strength adjust block 236 may either increase or decrease the drive strength of selected cells, depending on the overall effect of the substitution on the performance of the timing path.

As indicated above, it is contemplated that the drive strength adjust block 236 may determine which of the cells within the design to substitute for a logically equivalent component having a different drive strength. In a preferred embodiment, this may be accomplished by identifying a number of timing paths wherein each of the timing path including a source latch, a destination latch, and a number of components connected therebetween. The drive strength adjust block 236 may identify the number of components that are in each of the number of timing paths, and the order thereof.

The drive strength adjust block 236 may then substitute a first one of the number of components with a corresponding logically equivalent component with a different drive strength, and may determine the delay of the timing path. Then, the drive strength adjust block 236 may substitute the first one of the number of components with a corresponding logically equivalent component having yet another drive strength, and may determine the delay of the timing path. The drive strength adjust block 236 may then determine which cell substitution provided the optimum delay. This process may be repeated until all logically equivalent components having different drive strengths are substituted for the first one of the number of components. The drive strength adjust block 236 may then select the logically equivalent component that produces the optimum delay for the timing path.

This process may be continued for each of the components along the corresponding timing path, thereby resulting in an overall optimum delay for the corresponding timing path. The drive strength adjust block 236 may output a list of the selected components and the suggested drive strength therefor.

It is contemplated that the cells to be substituted may be recorded in an accumulated cell substitution list 240 via interface 242 during each of the number of iteration. The accumulated cell substitution list 240 may then be merged with a base cell substitution list 268 by merging block 244. The accumulated cell substitution list 240 may be provided to the merging block 244 via interface 242, and the base cell substitution list 268 may be provided to the merging block 244 via interface 272. The merging block 244 may provide an updated base cell substitution list 268 via interface 270. The updated base cell substitution list 268 may be provided to the extract RC file block 220 via interface 246, wherein an updated RC file may be generated and provided to the timing analysis block 224 for the next design iteration.

Execution controller 250 may control input block 216, extract RC file block 220, timing analysis block 224, compare block 228, report block 232, and drive strength adjust block 236 via interfaces 252, 254, 256, 258, 260, and 262, respectively. Execution controller 250 controls the flow of the design database through the data processing system 212 such that said design database is processed by the extracting RC file block 220, timing analysis block 224, comparing block 228, report block 232, drive strength adjust block 236, and the merging block 244 for a predetermined number of iterations, or until the design meets the predefined specification.

It is contemplated that the merging block 244 may include a resolving block 248 for resolving any conflict between the accumulated cell substitution list 240 and the base cell substitution list 268. An example of when a conflict may arise is when a particular cell is identified in more than one timing path (see FIG. 5) during different design iterations. That is, the base cell substitution list 268 may identify a particular cell within a first timing path and may indicate that the particular cell is to be substituted with a logically equivalent cell having a first drive strength. The accumulated cell substitution list 240, and during the current design iteration, may also identify the same cell within a second thing path and may indicate that the particular cell is to be substituted with a logically equivalent cell having a second drive strength. It is contemplated that the resolving block 248 may resolve this and other conflicts. In a preferred embodiment, the conflict is resolved based upon a predetermined priority scheme. Further details of the preferred priority scheme may be found in the above referenced U.S. patent application Ser. No. 08/597,931, which is incorporated herein by reference.

In addition to the above, it is contemplated that the exemplary embodiment may perform physical checks of the circuit design and indicate any physical check violations therein. A physical checks block 274 may receive the design database 214 from the input block 216 via interface 222. The physical checks block 274 may process the design database 214 and determine if any physical checks violations are present. The physical checks block 274 may provide any physical checks violations to physical report block 276 via interface 278. Typical physical checks violations may include, for example, a capacitance on a route that exceeds a maximum capacitance value, cross-talk between two routes exceeds a maximum cross-talk value, etc. Physical report block 276 may write a physical violations report 280 to memory via interface 282. Further, physical report block 276 may report the physical violations to a second drive strength adjust block 284.

To mitigate any physical check violations, the second drive strength adjust block 284 may select cells to be substituted with corresponding logically equivalent components having a different drive strength. It is contemplated that the cells selected by the second drive strength adjust block 284 may be recorded in a physical cell substitution list 288. Physical checks block 274, physical report block 276, and the second drive strength adjust block 284 may be controlled by execution controller 250 via interface 298.

After the execution controller 250 executes the extracting RC file block 220, timing analysis block 224, comparing block 228, report block 232, drive strength adjust block 236, and the merging block 244 for a predetermined number of iterations, a second merging block 290 may merge the final base cell substitution list 268 with the physical cell substitution list 288. It is contemplated that the second merging block 290 may include a resolving block 292 to resolve any conflict between the final base cell substitution list 268 and the physical cell substitution list 288. Merging block 290 may be controlled by execution controller 250 via interface 300.

An example of when a conflict may arise in the second merging block 290 is when a particular cell is identified both by the drive strength adjust block 284 and the drive strength adjust block 236. That is, the final base cell substitution list 268 may indicate that a particular cell is to be substituted with a logically equivalent cell having a first drive strength to correct a timing violation. The drive strength adjust block 284 may also identify the same cell and may indicate that the particular cell is to be substituted with a logically equivalent cell having a second drive strength to correct a physical checks violation. It is contemplated that the resolving block 292 may resolve these and other conflicts. In a preferred embodiment, the conflict is resolved using a predetermined priority scheme. Further details of the preferred priority scheme may be found in the above referenced U.S. patent application Ser. No. 08/597,931, which is incorporated herein by reference.

After all conflicts are resolved, the second merging block 290 may provide a final cell substitution list 296. In a preferred embodiment, the final cell substitution list 296 is provided to a manual placement tool, or floor-planning tool (not shown). The manual placement tool may have an interface for reading the final substitution list and make the substitutions indicated therein to the design database. A further description of the interface for importing the final cell substitution list into the manual placement tool can be found in the above referenced U.S. patent application Ser. No. 08/789,029, which has been incorporated herein by reference.

The output of the manual placement tool may then be provided to the place and route tool for final placement and routing. It is recommended that the resulting design database be run through the timing analysis tool and the physical checks tool to verify that the final design meets the predetermined specification.

Finally, it is contemplated that the drive strength adjust blocks 236 and 284 may be used to reduce the power consumption of a circuit design. For example, the drive strength adjust block 236 may identify particular timing paths within the design that have excess margin with respect to the timing specification. Under such circumstances, the drive strength adjust block 236 may substitute selected components along these timing paths with a corresponding logically equivalent component having a lower drive strength to reduce the power consumption of the circuit design.

Figure 5:
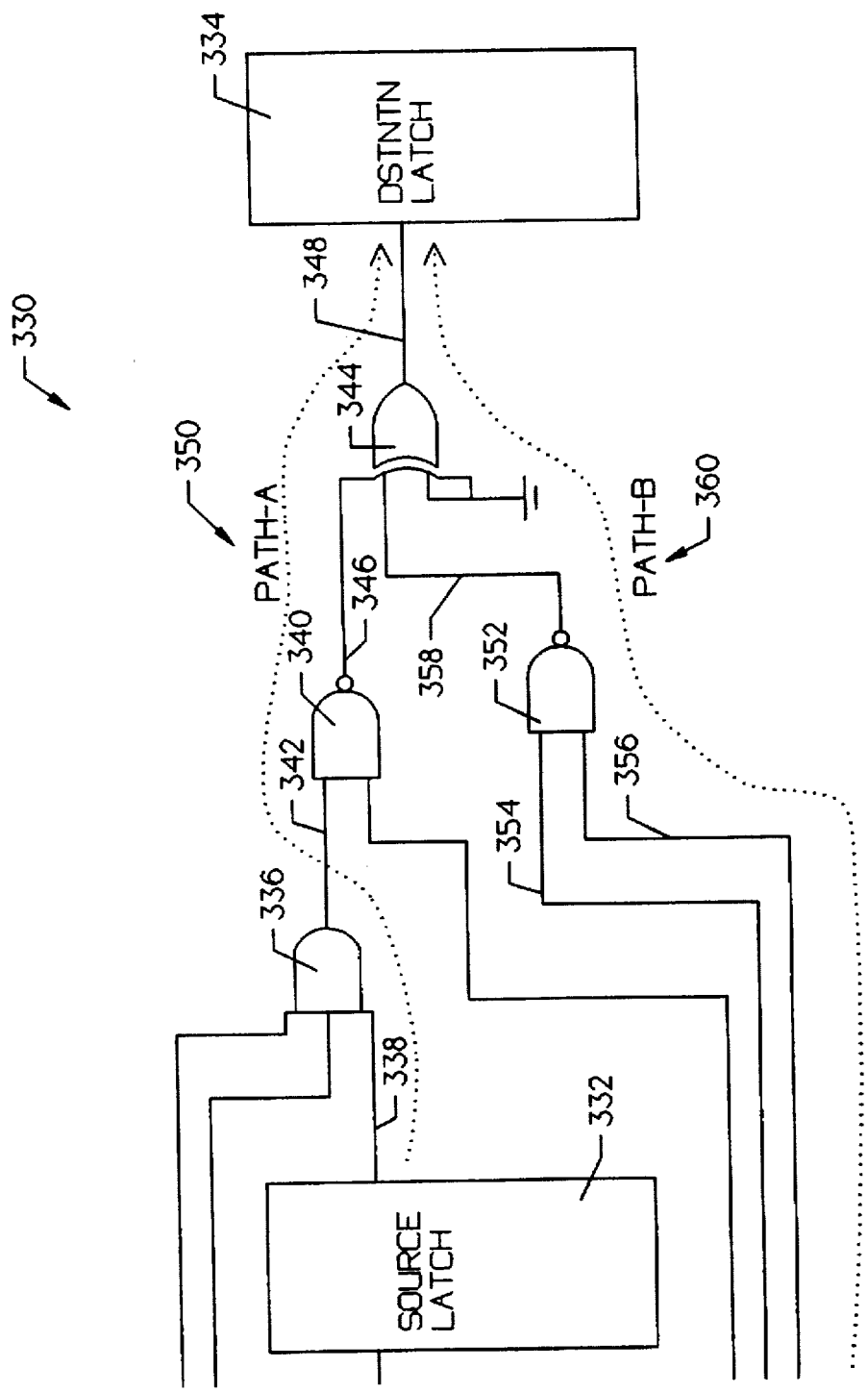
FIG. 5 is a schematic diagram showing two intersecting timing paths within a circuit design.

FIG. 5 is a schematic diagram showing two intersecting timing paths within a circuit design. The diagram is generally shown at 330. As indicated above, it is contemplated that the drive strength adjust block 236 (see FIG. 4) may determine which of the cells within the design to substitute for a logically equivalent component having a different drive strength. In a preferred embodiment, this may be accomplished by identifying a number of timing paths wherein each of the timing path including a source latch 332, a destination latch 334, and a number of components connected therebetween. In the illustrative circuit design, path-A 350 and path-B 360 are shown. Path-A 350 extends from source latch 332 to AND gate 336 via interface 338, from AND gate 336 to NAND gate 340 via interface 342, from NAND gate 340 to XOR gate 344 via interface 346, and finally to destination latch 334 via interface 348. Similarly, Path-B 360 extends from a source latch (not shown) to NAND gate 352 via interface 356, from NAND gate 352 to XOR gate 344 via interface 358, and finally to destination latch 334 via interface 348.

With respect to path-A 350, the drive strength adjust block 236 may substitute a first one of the number of components, for example component 336, with a corresponding logically equivalent component with a different drive strength, and may determine the delay of timing path-A 350. Then, the drive strength adjust block 236 may substituting the first one of the number of components 336 with a corresponding logically equivalent component having yet another drive strength, and may determine the delay of timing path-A 350. The drive strength adjust block 236 may then determine which cell substitution provided the optimum delay. This process may be repeated until all logically equivalent components having different drive strengths are substituted for the first one of the number of components 336. The drive strength adjust block 236 may then select the logically equivalent component that produces the optimum delay for timing path-A 350.

This process may be continued for each of the components along the corresponding timing path including gates 340 and 344, thereby resulting in an overall optimum delay for the corresponding timing path-A 350.

Similarly, and with respect to path-B 360, the drive strength adjust block 236 may substitute a first one of the number of components, for example component 352, with a corresponding logically equivalent component with a different drive strength, and may determine the delay of timing path-B 360. Then, the drive strength adjust block 236 may substituting the first one of the number of components 352 with a corresponding logically equivalent component having yet another drive strength, and may determine the delay of timing path-B 360. The drive strength adjust block 236 may then determine which cell substitution provided the optimum delay. This process may be repeated until all logically equivalent components having different drive strengths are substituted for the first one of the number of components 352. The drive strength adjust block 236 may then select the logically equivalent component that produces the optimum delay for timing path-B 360.

This process may be continued for each of the components along the corresponding timing path including gate 344, thereby resulting in an overall optimum delay for the corresponding timing path-B 360.

In the present example, it is readily apparent that the drive strength adjust block 236 may produce a conflict with respect to XOR gate 344. That is, drive strength adjust block 236 may conclude that XOR gate 344 should be substituted with a logically equivalent gate having a first drive strength when analyzing timing path-A 350, and may conclude that XOR gate 344 should be substituted with a logically equivalent gate having a second drive strength when analyzing timing path-B 360. Thus, it is contemplated that drive strength adjust block 236 may itself have a resolving block (not shown) for resolving these conflicts. Further details of the preferred priority scheme may be found in the above referenced U.S. patent application Ser. No. 08/597,931, which is incorporated herein by reference. After the conflict is resolved, the drive strength adjust block 236 may output a list of the selected components and the suggested drive strength therefor.

Figure 6:
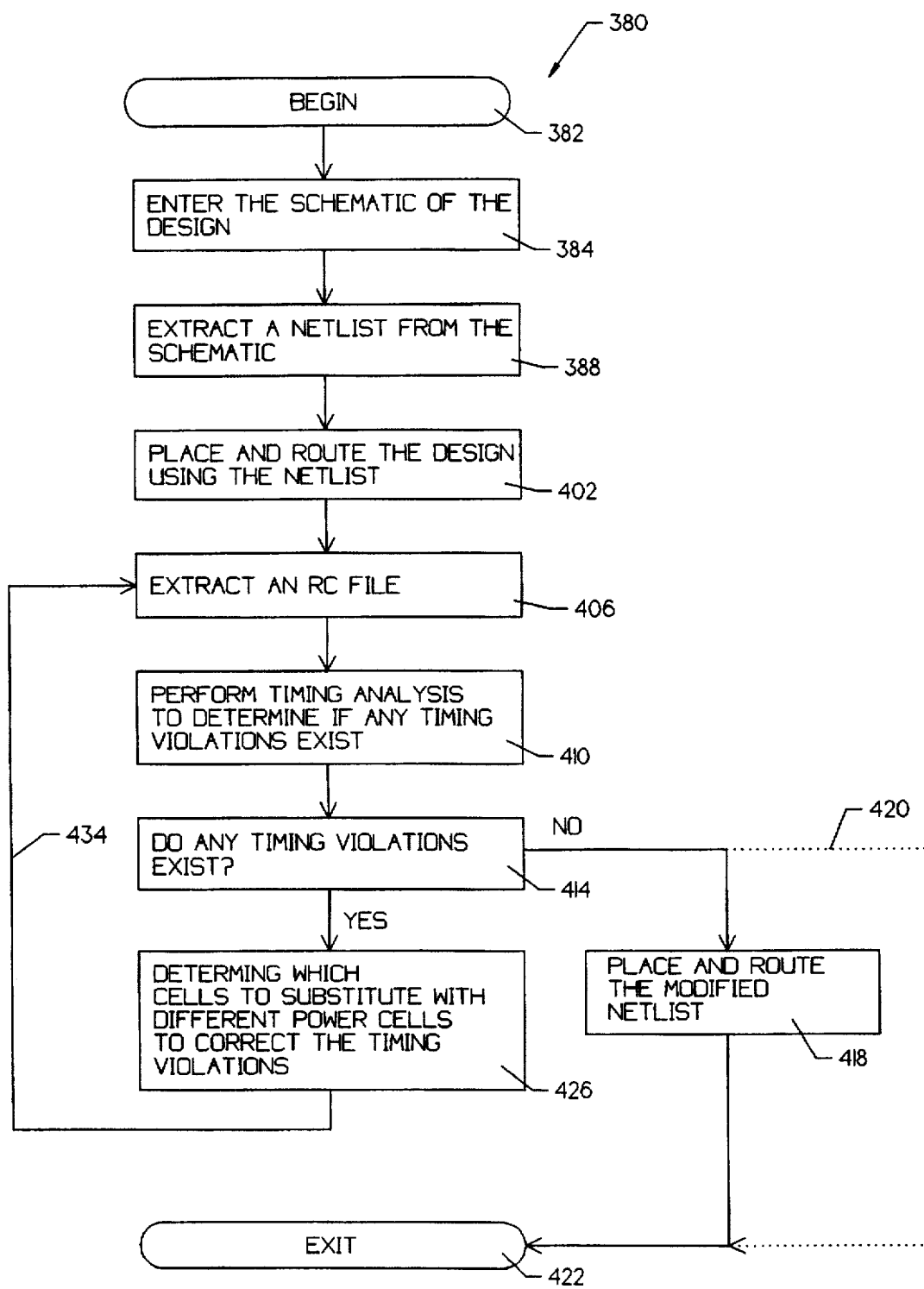
FIG. 6 is a flow diagram showing a first exemplary design method of the present invention.

FIG. 6 is a flow diagram showing a first exemplary design method of the present invention. The diagram is generally shown at 380. The method is entered at element 382. A logic designer typically enters a schematic into a design database as shown at 384, using selected components from a component library. The schematic is typically entered via a database editor running on an engineering workstation, and the design database is typically stored therein.

After the schematic has been entered into the design database, the schematic may be processed, or expanded, into a design netlist as shown at 388. The design netlist typically identifies each of the library cells that are used in the schematic, and further identifies the interconnections therebetween.

The resulting design netlist may then be provided to a place and route tool as shown at 402. The place and route tool may read the "physical representation" of each cell within the design, and place the physical representation within an imaginary two dimensional box. For integrated circuit designs, the imaginary box often corresponds to the outer periphery of the resulting integrated circuit die. Once all of the cells have been placed, the place and route tool interconnects the cells in accordance with the design netlist. Depending on the technology and the power bussing strategy of the component library, the place and route tool may provide the required interconnections (or routes) using up to five layers of metal.

After the place and route netlist is generated, the designer may use an extraction tool to extract an RC file therefrom as shown at 406. The extraction tool may process the place and route netlist and may determine the resistance, capacitance, or any other parameters selected by the designer, for each net in the design. For example, the extraction tool may determine the capacitance of a particular net by calculating the input load capacitance for each gate connected to the net, and may further determine the capacitance between a corresponding route and any other layer within the design, including the substrate. That is, the extraction tool may determine what layers the particular route overlaps, and may calculate the capacitance generated therebetween.

To provide accurate results, the extraction tool is often provided with technology specific parameters including oxide thicknesses between metal layers, the permittivity of each of the oxide layers, etc. These technology specific parameters are often stored in a technology file, which may be read by the extraction tool.

After the extraction tool provides an RC file for the design, the RC file and the original netlist may be provided to a timing analysis tool as shown at 410. The timing analysis tool processes the netlist and the RC file to determine the timing of predetermined circuit paths within the design. Part of the pre-processing performed by the timing analysis tool is to read the timing information from the component library for each of the cells used in the design. For example, the timing information stored in the component library may include parameters such as a base delay, and delay per unit of capacitance. The timing analysis tool may use the timing information, along with the RC file to determine the delay for each cell within the design. Thereafter, the timing analysis tool identifies predetermined timing paths within the design, and adds the delay for each of the cells to determine an overall path delay for each timing path. The timing analysis tool may then report all timing paths that have an overall path delay that falls outside of a predetermined timing specification. That is, the timing analysis tool may determine if any timing violations exist.

If no timing violations exist, the design is deemed to meet the predefined specification and the method is exited as shown at 422 via interface 420. That is, during the first design iteration, it is not necessary to auto place and route the design again because no modifications have been made to the design database. If, however, the timing analysis tool identifies timing violations, the designer must evaluate each timing violation, and provide corrections to the design database to overcome such timing violations.

To mitigate any timing violations that may exist, a drive strength adjust means 426 may be provided for substituting selected components along selected timing paths with a corresponding logically equivalent component having a different drive strength. The drive strength adjust means 426 is further described above with reference to FIGS.

After cells have been identified for substitution as shown at 426, a cell substitution list is created and provided to the extraction tool 406 via extraction too The extraction tool 406 may process the original place and route netlist and the cell substitution list and may determine the resistance, capacitance, or any other parameters selected by the designer, for each net in the design.

Unlike the prior art, it is recognized that it is not necessary to repeat the place and route step 402 during each design iteration. That is, the present invention recognizes that the placement and routing of the design does not significantly change, particularly when only cell substitutions are made to the design database. Further, it is recognized that the schematic need not be changed or expanded into a design netlist during each design iteration.

Rather, the extraction tool 406 may incorporate the cell substitution list provided by step 426 via interface 434, and may calculate an updated RC file based thereon. The updated RC file may then be used by the timing analysis tool 410 to determine if the updated design will meet the design specification. The process of extracting an RC file, performing timing analysis, and identifying cells for substitution may be repeated until the design falls within the design specification or until a predetermined number of design iterations have been achieved. After the design meets the design specification, a final place and route may be performed as shown at 418, and the method may be exited as shown at 422.

Figure 7:
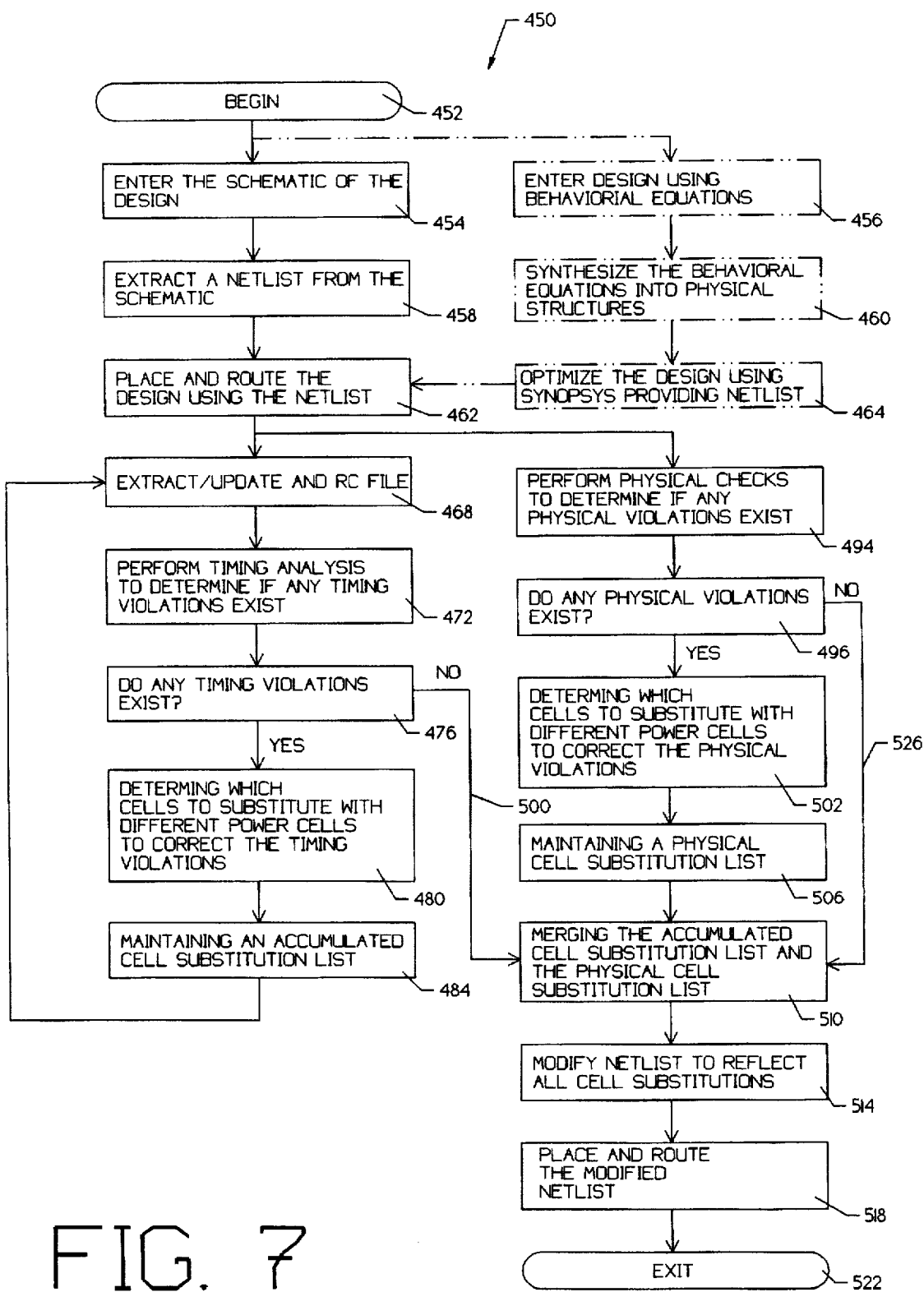
FIG. 7 is a flow diagram showing a second exemplary design method of the present invention.

FIG. 7 is a flow diagram showing a second exemplary design method of the present invention. The diagram is generally shown at 450. The method is entered at element 452. A logic designer typically enters a schematic into a design database as shown at 454, using selected components from a component library. The schematic is typically entered via a database editor running on an engineering workstation, and the design database is typically stored therein.

After the schematic has been entered into the design database, the schematic may be processed, or expanded, into a design netlist as shown at 458. The design netlist typically identifies each of the library cells that are used in the schematic, and further identifies the interconnections therebetween.

An alternative approach to entering the design into the design database involves using sophisticated synthesis tools. In such an approach, the designer enters logical equations describing the function of the design as shown at 456. A first synthesis tool 460 implements the logical equations using logical cells from the component library. A second synthesis tool 464 may then minimizes the logic using known techniques, and may attempt to optimize the design based on a number of predetermined factors. For example, the designer may direct the synthesis tool to optimize the design for speed, power, or some other factor.

The resulting design netlist may then be provided to a place and route tool as shown at 462. There are a number of place and route tools available on the market today. The place and route tool may read the "physical representation" of each cell within the design and place the physical representation within an imaginary two dimensional box. For integrated circuit designs, the imaginary box often corresponds to the outer periphery of the resulting integrated circuit die. Once all of the cells have been placed, the place and route tool interconnects the cells in accordance with the design netlist. Depending on the technology and the power bussing strategy of the component library, the place and route tool may provide the required interconnections (or routes) using up to five layers of metal.

In most large designs, the place and route netlist is hierarchical in nature. Thus, the place and route netlist typically only identifies the placement coordinates of each of the cells within the design, and does not contain the actual physical representation of each cell. Rather, the place and route netlist contains pointers to the physical representations stored in the component library. Thus, if a particular cell is used a number of times within the design, only one copy of the physical representation is required to be stored. The place and route netlist typically also identifies the interconnections, or routes, by the coordinates of the starting, ending, and any other points where the route changes direction. Further, the width of the route is also identified.

After the place and route netlist is generated, the designer may use an extraction tool to extract an RC file therefrom as shown at 468. The extraction tool may process the place and route netlist and may determine the resistance, capacitance, or any other parameters selected by the designer, for each net in the design. For example, the extraction tool may determined the capacitance of a particular net by calculating the input load capacitance for each gate connected to the net, and may further determine the capacitance between a corresponding route and any other layer within the design, including the substrate. That is, the extraction tool may determine what layers the particular route overlaps, and may calculate the capacitance generated therebetween.

To provide accurate results, the extraction tool is often provided with technology specific parameters including oxide thicknesses between metal layers, the permittivity of each of the oxide layers, etc. These technology specific parameters are often stored in a technology file, which may be read by the extraction tool.

After the extraction tool provides an RC file for the design, the RC file and the original netlist may be provided to a timing analysis tool as shown at 472. The timing analysis tool processes the netlist and the RC file to determine the timing of predetermined circuit paths within the design. Part of the pre-processing performed by the timing analysis tool is to read the timing information from the component library for each of the cells used in the design. For example, the timing information stored in the component library may include parameters such as a base delay, and delay per unit of capacitance. The timing analysis tool may use the timing information, along with the RC file to determine the delay for each cell within the design. Thereafter, the timing analysis tool identifies predetermined timing paths within the design, and adds the delay for each of the cells to determine an overall path delay for each timing path. The timing analysis tool may then report all timing paths that have an overall path delay that falls outside of a predetermined timing specification. That is, the timing analysis tool may determine if any timing violations exist.

If no timing violations exist, the design is deemed to meet the predefined timing specification, and control is passed to step 510 via interface 500. If, however, the timing analysis tool identifies timing violations, the designer must evaluate each timing violation, and provide corrections to the design to overcome such timing violations.

To mitigate any timing violations that may exist, a drive strength adjust tool 480 may be provided for substituting selected components along selected timing paths with a corresponding logically equivalent component having a different drive strength. The drive strength adjust tool 480 is further described above with reference to FIGS. 4–5.

After cells have been identified for substitution by the drive strength adjust tool 480, an accumulated cell substitution list is created at shown at 484. The accumulated cell substitution list identifies the cells that are to be substituted for a given design iteration. The accumulated cell substitution list may be provided to the extraction tool 468 via interface 492. The extraction tool 468 may process the original place and route netlist and the accumulated cell substitution list and may determine the resistance, capacitance, or any other parameters selected by the designer, for each net in the design.

Unlike the prior art, it is recognized that it is not necessary to repeat the place and route step 462 during each design iteration. That is, the present invention recognizes that the placement and routing of the design does not significantly change, particularly when only cell substitutions are made to the design database. Further, it is recognized that the schematic or behavioral equations need not be updated during each design iteration. Thus, the schematic need not be expanded or the behavioral equations need not be synthesized during each of the subsequent design iterations. This may significantly reduce the design cycle time.

In the exemplary embodiment, the extraction tool 468 may incorporate the accumulated cell substitution list provided by step 484, and may calculate an updated RC file based thereon. The updated RC file may then be used by the timing analysis tool 472 to determine if the updated design will meet the design specification. The process of extracting an RC file, performing timing analysis, identifying cells for substitution, and creating an accumulated cell substitution list may be repeated until the design falls within the design specification, or until a predetermined number of design iterations has been reached.

In addition to the above, it is contemplated that the exemplary embodiment may perform physical checks on the circuit design as shown at 494. The physical checks step may indicate any physical check violations therein, as shown at 496. The physical checks step 494 may report a violation if, for example, the capacitance on a route exceeds a maximum capacitance value, the cross-talk between two routes exceeds a maximum cross-talk value, etc.

If no physical checks violations exist, control is passed to step 510 via interface 526. If, however, physical checks violations exist, a second drive strength adjust step 502 may be provided for selecting cells to be substituted with a corresponding logically equivalent component having a different drive strength to mitigate such physical check violations.

It is contemplated that the cells selected by the second drive strength adjust step 502 may be recorded in a physical checks substitution list, as shown at 506. After the above described timing violation design iterations are complete, and the design meets the predetermined timing specification, a merging step 510 may merge the accumulated cell substitution list with the physical checks substitution list. It is contemplated that the merging step 510 may resolve any conflict between the accumulated cell substitution list with the physical checks substitution list, as described above.

An example of when a conflict may arise during the merging step 510 is when a particular cell is identified both by the drive strength adjust step 502 and the drive strength adjust step 480. That is, the accumulated cell substitution list may indicate that a particular cell is to be substituted with a logically equivalent cell having a first drive strength to correct a timing violation. The drive strength adjust step 502 may also identify the same cell and may indicate that the particular cell is to be substituted with a logically equivalent cell having a second drive strength to correct a physical checks violation. It is contemplated that the present invention may resolve these and other conflicts. In a preferred embodiment, the conflict is resolved using a predetermined priority scheme. Further details of the preferred priority scheme may be found in the above referenced U.S. patent application Ser. No. 08/597,931, which is incorporated herein by reference.

After all conflicts are resolved, the merging step 510 may provide a final substitution list. In the exemplary embodiment, the final substitution list is used by the designer to modify the design database accordingly, as shown at 514. Thereafter, the modified design database is provided to the place and route tool as shown at 518, for final placement and routing. The exemplary method may then be exited as shown at 522.

Figure 8:
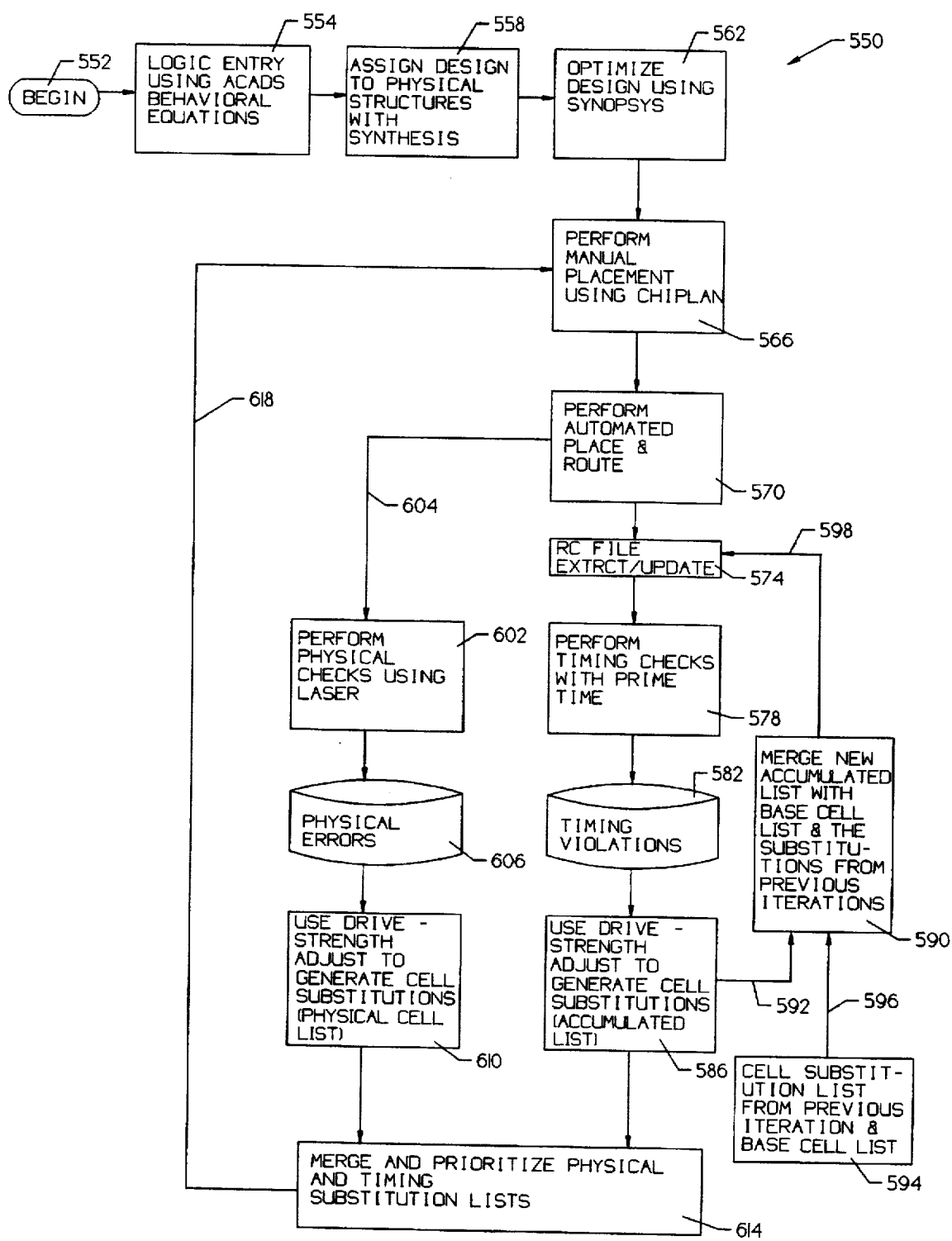
FIG. 8 is a flow diagram showing a third exemplary design method of the present invention.

FIG. 8 is a flow diagram showing a third exemplary design method of the present invention. The diagram is generally shown at 550. The method is entered at element 552. A logic designer typically enters logical equations describing the function of the design, as shown at 554. In the exemplary embodiment, a logic entry tool called ACADS is used. A first synthesis tool 558 may then implement the logical equations using logical cells from a component library. A second synthesis tool 562 may then minimizes the logic using known techniques, and may attempt to optimize the design based on a number of predetermined factors. For example, the designer may direct the synthesis tool to optimize the design for speed, power, or some other factor. In the exemplary embodiment, a widely known synthesis tool called SYNOPSYS is used. The output of the second synthesis tool may be a design netlist, and preferably in the EDIF format.

The resulting design netlist may then be provided to a manual placement tool as shown at 566. In some cases, it is advantageous to manually place certain critical cells within the design. The critical cells are often larger macrocells such as ALU's, RAMs, ROMs, or other macro blocks. The manual placement of these cells is typically accomplished via a floor-planning tool. Stand alone floor-planning tools are available. However, many place and route tools have at least a limited floor-planning capability. After the critical cells are manually placed by the designer, the remaining cells may be automatically placed and routed by the place and route tool, as shown at 570.

After the place and route netlist is generated, the designer may use an extraction tool to extract an RC file therefrom as shown at 574. The extraction tool may process the place and route netlist and may determine the resistance, capacitance, or any other parameters selected by the designer, for each net in the design. For example, the extraction tool may determined the capacitance of a particular net by calculating the input load capacitance for each gate connected to the net, and may further determine the capacitance between a corresponding route and any other layer within the design, including the substrate. That is, the extraction tool may determine what layers the particular route overlaps, and may calculate the capacitance generated therebetween.

To provide accurate results, the extraction tool is often provided with technology specific parameters including oxide thicknesses between metal layers, the permittivity of each of the oxide layers, etc. These technology specific parameters are often stored in a technology file, which may be read by the extraction tool.

After the extraction tool provides an RC file for the design, the RC file and the original netlist may be provided to a timing analysis tool as shown at 578. The timing analysis tool processes the netlist and the RC file to determine the timing of predetermined circuit paths within the design. Part of the pre-processing performed by the timing analysis tool is to read the timing information from the component library for each of the cells used in the design. For example, the timing information stored in the component library may include parameters such as a base delay, and delay per unit of capacitance. The timing analysis tool may use the timing information, along with the RC file to determine the delay for each cell within the design. Thereafter, the timing analysis tool identifies predetermined timing paths within the design, and adds the delay for each of the cells to determine an overall path delay for each timing path. The timing analysis tool may then report all timing paths that have an overall path delay that falls outside of a predetermined timing specification. That is, the timing analysis tool may determine if any timing violations exist, and may store a record of the timing violations as shown at 582.

If the timing analysis tool identifies timing violations, the designer must evaluate each timing violation, and provide corrections to the design to overcome such timing violations. To mitigate any timing violations that may exist, a first drive strength adjust tool 586 may be provided to identify selected components along selected timing paths to substitute with a corresponding logically equivalent component having a different drive strength. The first drive strength adjust tool 586 is further described above with reference to FIGS. 4–5.

After selected cells have been identified for substitution by the first drive strength adjust tool 586, an accumulated cell substitution list is created. The accumulated cell substitution list identifies the cells that are to be substituted during the present design iteration. The accumulated cell substitution list may be provided to a first merging step 590 via interface 592. Further, a base cell substitution list is provided to the first merging step 590 via interface 596. In the exemplary embodiment, the base cell substitution list is updated each design iteration and thus contains a master list of all cell substitutions.

The first merging step 590 merges the accumulated cell substitution list with the base cell substitution list thereby resulting in an updated base cell substitution list.

It is contemplated that the first merging step 590 may resolve any conflict between the accumulated cell substitution list and the base cell substitution list. An example of when a conflict may arise is when a particular cell is identified in more than one timing path during different design iterations. That is, the base cell substitution list may identify a particular cell within a first timing path and may indicate that the particular cell is to be substituted with a logically equivalent cell having a first drive strength. The accumulated cell substitution list, and during the current design iteration, may also identify the same cell within a second timing path and may indicate that the particular cell is to be substituted with a logically equivalent cell having a second drive strength. It is contemplated that the first merging step 590 may resolve this and other conflicts. In a preferred embodiment, the conflict is resolved based upon a predetermined priority scheme. Further details of the preferred priority scheme may be found in the above referenced U.S. patent application Ser. No. 08/597,931, which is incorporated herein by reference.

The updated base cell substitution list may be provided to the extracting tool 574, wherein an updated RC file may be generated and provided to the timing analysis tool 578 for the next design iteration. The extraction tool 598 may process the original place and route netlist and the updated base cell substitution list and may determine the resistance, capacitance, or any other parameters selected by the designer, for each net in the design.

Unlike the prior art, it is recognized that it is not necessary to repeat the place and route step 570 during each design iteration. That is, the present invention recognizes that the placement and routing of the design does not significantly change, particularly when only cell substitutions are made to the design database. Further, it is recognized that the behavioral equations need not be updated during each design iteration. Thus, the behavioral equations need not be synthesized during each of the subsequent design iterations. This may significantly reduce the design cycle time.

In the exemplary embodiment, the process of extracting an RC file, performing timing analysis, identifying cells for substitution, creating an accumulated cell substitution list, and merging the accumulated cell substitution list with the base cell substitution list may be repeated until the design falls within the design specification, or until a predetermined number of design iterations has been reached.

In addition to the above, it is contemplated that the exemplary embodiment may perform physical checks on the circuit design as shown at 602. The physical checks step 602 may indicate any physical check violations therein, and the physical check violations may be stored as shown at 606.

If physical checks violations are detected, a second drive strength adjust tool 610 may be provided for selecting cells for substitution with a corresponding logically equivalent component having a different drive strength to mitigate such physical check violations. It is contemplated that the cells selected by the second drive strength adjust step 610 may be recorded in a physical checks substitution list as shown at 610.

After the above described timing violation design iterations are complete, and the design meets the predetermined timing specification, a second merging step 614 may merge the accumulated cell substitution list with the physical checks substitution list. It is contemplated that the second merging step 614 may resolve any conflict between the accumulated cell substitution list and the physical checks substitution list, as described above.

An example of when a conflict may arise during the second merging step 614 is when a particular cell is identified both by the first drive strength adjust tool 586 and the second drive strength adjust tool 610. That is, the accumulated cell substitution list may indicate that a particular cell is to be substituted with a logically equivalent cell having a first drive strength to correct a timing violation. The second drive strength adjust tool 610 may also identify the same cell and may indicate that the particular cell is to be substituted with a logically equivalent cell having a second drive strength to correct a physical checks violation. It is contemplated that the present invention may resolve these and other conflicts. In a preferred embodiment, the conflict is resolved using a predetermined priority scheme. Further details of the preferred priority scheme may be found in the above referenced U.S. patent application Ser. No. 08/597,931, which is incorporated herein by reference.

After all conflicts are resolved, the second merging step 614 may provide a final substitution list. In the exemplary embodiment, the final substitution list is provided to the manual placement tool 566 via interface 618. The designer may then make the necessary modifications to the design database. Thereafter, the design database may be provided to the place and route tool, for final placement and routing. The exemplary method may then be exited (not shown), or the process may be repeated to verify that the design database meets the circuit design specification.

Figure 9:
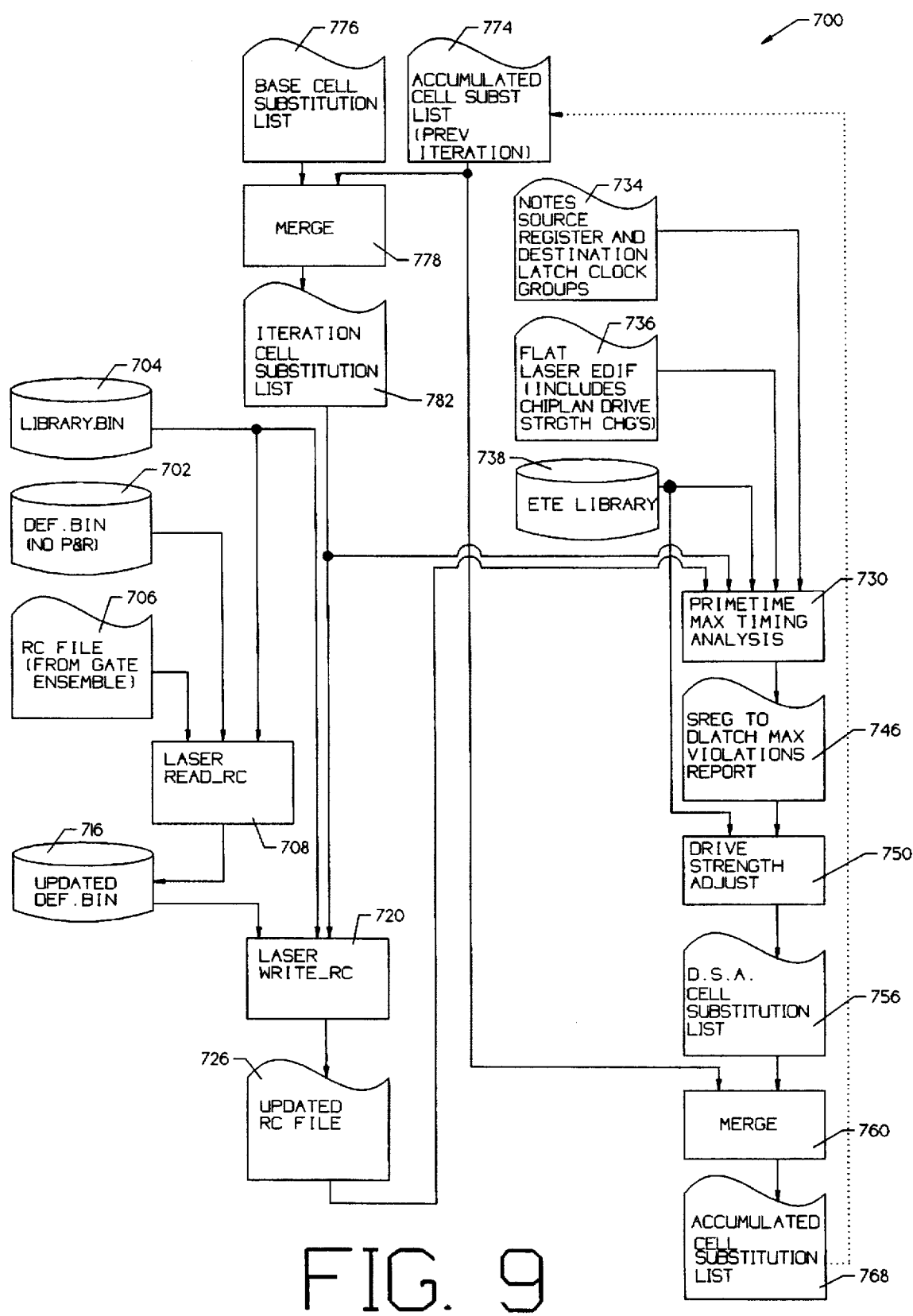
FIG. 9 is a flow diagram showing an fourth exemplary design method of the present invention.

FIG. 9 is a flow diagram showing a fourth exemplary design method of the present invention. The diagram is generally shown at 700. The circuit design database is shown at 702 wherein the designation DEF.BIN refers to a definition file (design database) stored in a data processing system. The design database 702 is the originally entered database, and contains no place and route information.

The design database is placed and routed using a place and route tool known as Gate Ensemble™ available from Cadence Design Systems. An RC file is extracted from the place and route database as shown at 706. Finally, a component library is provided as shown at 704. The component library may include a number of cells wherein each of the cells implements a different function. For example, the component library may include NAND gates, NOR gates, XOR gates, Registers, I/O cells, etc. Further, each of the individual cells may have a logically equivalent component with a different drive strength. Finally, selected cells of the component library may have a number of "representations". For example, a cell may have a "symbolic representation", a "schematic representation", and a "physical representation" as described above.

The design database 702, the component library 704, and the RC file 706 are all provided to a tool called LASER. LASER is a tool developed by the assignee of the present invention to manipulate design database information. For example, the READ-RC module 708 of the LASER program reads the RC file, the design database, and the component library and provides an updated design database as shown at 716. The updated design database contains the RC information for each net within the design database.

The WRITE_RC module 720 of the LASER program reads the updated design database 716, the component library 704, and an iteration cell substitution list 782, and provides an updated RC file 726. During the first design iteration, the iteration cell substitution list 782 is empty.

The updated RC file is provided to a timing analysis tool known as PRIMETIME as shown at 730. PRIMETIME is a timing analysis tool provided by the assignee of the present invention. Besides reading the updated RC file, PRIMETIME may also read the iteration cell substitution list 782, an ETE library 738, Chiplan drive strength changes 736, and a file indicating selected source and destination register clock groups 734. The ETE library 738 is a file containing various characteristics of each cell in the component library 704 for the selected technology. For example, the ETE library 738 may include the delay information for each cell in the component library 704.

PRIMETIME 730 determines the timing of predetermined circuit paths within the design. In a preferred mode, PRIMETIME 730 determined the timing of the paths within and between each of the selected source and destination register clock groups 734. PRIMETIME 730 uses the ETE library 738 to determine the delay of each component with each timing path. That is, part of the pre-processing performed by PRIMETIME 730 is to read the timing information from the ETE library 738 for each of the cells used in the design. For example, the timing information stored in the ETE library 738 may include parameters such as a base delay, and delay per unit of capacitance. PRIMETIME 730 may use the timing information, along with the RC file to determine the delay for each cell within the design. Thereafter, the timing analysis tool identifies predetermined timing paths within the design, and adds the delay for each of the cells to determine an overall path delay for each timing path.

PRIMETIME 730 may then report all timing paths that have an overall path delay that falls outside of a predetermined timing specification as shown at 746. That is, the timing analysis tool may determine if any thing violations exist, and may store a record of the timing violations.

If PRIMETIME 730 identifies timing violations, the designer must evaluate each timing violation, and provide corrections to the design to overcome such timing violations. To mitigate any timing violations that may exist, a drive strength adjust tool 750 may be provided to identify selected components along selected timing paths to substitute with a corresponding logically equivalent component having a different drive strength. The drive strength adjust tool 750 is further described above with reference to FIGS. 4–5.

In a preferred embodiment, after selected cells have been identified for substitution by the drive strength adjust tool 750, a first merge program 760 merges the accumulated cell substitution list of the previous design iteration 774 with the drive strength adjust cell substitution list 756 recommended by the drive strength adjust tool 750, thereby resulting in an updated accumulation cell substitution list 768.

It is contemplated that the first merging program 760 may resolve any conflict between the accumulated cell substitution list of the previous iteration and the substitution list 756 provided by the drive strength adjust tool 750. An example of when a conflict may arise is when a particular cell is identified in more than one timing path during different design iterations. That is, the accumulated cell substitution list may identify a particular cell within a first timing path and may indicate that the particular cell is to be substituted with a logically equivalent cell having a first drive strength. The drive strength adjust tool 750, and during the current design iteration, may also identify the same cell within a second timing path and may indicate that the particular cell is to be substituted with a logically equivalent cell having a second drive strength. It is contemplated that the first merging program 760 may resolve this and other conflicts. In a preferred embodiment, the conflict is resolved based upon a predetermined priority scheme. Further details of the preferred priority scheme may be found in the above referenced U.S. patent application Ser. No. 08/597,931, which is incorporated herein by reference.

The updated accumulated cell substitution list may then be merged with a base cell substitution list 776 as shown at 778. The base cell substitution list 776 is a master list of all existing cell substitutions, and provides the starting point from which future substitutions are made. The merging program 778 may resolve any conflicts that may exist between the accumulated cell substitution list and the base cell substitution list 776, as described above.

After all conflicts are resolved, the merging program 778 may provide an iteration cell substitution list 782. The iteration cell substitution list 782 may then be provided to the WRITE_RC module 720 of the LASER program and to PRIMETIME 730.

It is contemplated that the process of updating the RC file 728, running PRIMETIME 730, writing a timing violations report 746, executing the drive strength adjust tool 750, creating the drive strength adjust cell substitution list 756, merging the drive strength adjust cell substitution list with the accumulated cell substitution list from the previous iteration 760, providing an updated accumulated cell substitution list 774, merging the updated accumulated cell substitution list with the base cell substitution list 778, and providing an iteration cell substitution list 782 may be repeated until the design meets the desired timing specification, or until a predetermined number of design iterations have been achieved.

Having thus described the preferred embodiments of the present invention, those of skill in the art will readily appreciate that the teachings found herein may be applied to yet other embodiments within the scope of the claims hereto attached.

We claim:

1. A system for correcting timing violations in a circuit design, wherein the circuit design is represented in a circuit design database including a number of components selected from a component library, selected components of the component library having at least one corresponding logically equivalent component with a different drive strength, the system comprising:

a. input means for inputing the circuit design database into the system, wherein the circuit design database includes a physical placement location of each component within the circuit design and routing information for routes between selected components within the circuit design;

b. extracting means for extracting an RC file from the circuit design database wherein the RC file contains entries that represent the electrical load on selected components within the circuit design;

c. analyzing means for analyzing a number of timing paths within the circuit design wherein said analyzing means calculates the delay of selected components along each of the number of timing paths and sums the delays of the selected components;

d. comparing means coupled to said analyzing means for comparing the delay along a selected timing path with a predefined specification;

e. first drive strength adjust means coupled to said comparing means for substituting selected components along selected timing paths with a corresponding logically equivalent component having a different drive strength; and f. executing means for executing said extracting means, said analyzing means, said comparing means, and said first drive strength adjust means for a predetermined number of iterations.

2. A system according to claim 1 further comprising first recording means coupled to said first drive strength adjust means for recording an accumulated cell substitution list of the selected components that are substituted by said first drive strength adjust means during each of the number of iterations.

3. A system according to claim 2 further comprising storing means for storing a base cell substitution list of substituted components.

4. A system according to claim 3 further comprising first merging means for merging the accumulated cell substitution list of the selected components into the base cell substitution list of substituted components after each of the number of iterations, thereby resulting in a new base cell substitution list.

5. A system according to claim 4 wherein said first merging means includes resolving means for resolving any conflicts between the substituted components of the base cell substitution list and the selected components of the accumulated cell substitution list.

6. A system according to claim 5 further comprising providing means coupled to said extracting means for providing the new base cell substitution list to said extracting means during each of the number of iterations.

7. A system according to claim 1 wherein said circuit design database includes delay information for each of the number of components within the circuit design database.

8. A system according to claim 7 wherein said circuit design database includes electrical load information presented by each of the number of components within the circuit design database.

9. A system according to claim 8 wherein said delay information includes the expected delay for each of the number of components as a function of electrical load.

10. A system according to claim 9 wherein predetermined ones of said number of components are latches.

11. A system according to claim 10 wherein said delay information includes setup and hold times for each of said latches.

12. A system according to claim 1 further comprising:
   a. physical check means for performing physical checks of the circuit design and providing a result, said physical check means comparing the result of the physical check with a predetermined physical check specification;
   b. physical check reporting means coupled to said physical check means for reporting a violation if said physical check means determines that the result of the physical check exceeds the predetermined physical check specification; and
   c. second drive strength adjust means coupled to said physical check reporting means for substituting selected components with a corresponding logically equivalent component having a different drive strength.

13. A system according to claim 12 wherein said physical check reporting means reports a violation if the capacitance on a route exceeds a maximum capacitance value.

14. A system according to claim 12 wherein said physical check reporting means reports a violation if the cross-talk between two routes exceeds a maximum cross-talk value.

15. A system according to claim 12 further comprising second recording means coupled to said second drive strength adjust means for recording a physical cell substitution list of the selected components that are substituted by said second drive strength adjust means.

16. A system according to claim 15 further comprising first recording means coupled to said first drive strength adjust means for recording an accumulated cell substitution list of the selected components that are substituted by said first drive strength adjust means during each of the number of iterations, storing means for storing a base cell substitution list of substituted components, and first merging means for merging the accumulated cell substitution list of the selected components and the base cell substitution list of substituted components after each of the number of iterations.

17. A system according to claim 16 further comprising a second merging means for merging the cell substitution list and the base cell substitution list after the number of iterations have been completed, thereby resulting in a final cell substitution list.

18. A system according to claim 17 wherein said second merging means includes second resolves means for resolves any conflicts between the substituted components of the base cell substitution list and the selected components of the physical cell substitution list.

19. A system according to claim 18 further comprising providing means for providing the final cell substitution list to a manual placement tool.

20. A method for correcting timing violations in a circuit design, wherein the circuit design is represented in a circuit design database including a number of components selected from a component library, selected components of the component library having at least one corresponding logically equivalent component with a different drive strength, the method comprising the steps of:
   a. inputing the circuit design database into a data processing system, wherein the circuit design database includes a physical placement location of each component within the circuit design and routing information for routes between selected components within the circuit design;
   b. extracting an RC file from the circuit design database wherein the RC file contains entries that represent the electrical load on selected components within the circuit design;
   c. analyzing the delay of a number of timing paths within the circuit design by calculating the delay of selected components along each of the number of timing paths and summing the delays of the selected components;
   d. comparing the delay of each timing path with a predefined specification;
   e. reporting a violation if the delay along a selected timing path is determined to exceed the predefined specification;
   f. substituting selected components along selected timing paths with the corresponding logically equivalent component having a different drive strength to improve the delay of the corresponding timing path; and
   g. repeating steps (b) through (f) for a predetermined number of iterations.

21. A method according to claim 20 further comprising the step of recording an accumulated cell substitution list of the selected components that are substituted by said substitution step (f) during each of the number of iteration.

22. A method according to claim 21 further comprising the step of storing a base cell substitution list of substituted components.

23. A method according to claim 22 further comprising the step of merging the accumulated cell substitution list of the selected components into the base cell substitution list of substituted components after each of the number of iterations, thereby resulting in a new base cell substitution list.

24. A method according to claim 23 wherein said merging step further resolves any conflicts between the substituted components of the base cell substitution list and the selected components of the accumulated cell substitution list.

25. A method according to claim 24 further comprising the step of providing the new base cell substitution list to said extracting step (b) during each of the number of iterations.

26. A method according to claim 20 wherein said circuit design database includes delay information for each of the number of components within the circuit design database.

27. A method according to claim 26 wherein said circuit design database includes electrical load information presented by each of the number of components within the circuit design database.

28. A method according to claim 27 wherein said delay information includes the expected delay for each of the number of components as a function of electrical load.

29. A method according to claim 28 wherein predetermined ones of said number of components are latches.

30. A method according to claim 29 wherein said delay information includes setup and hold times for each of said latches.

31. A method according to claim 20 further comprising the steps of:
 h. performing physical checks of the circuit design and providing a result, and comparing the results of the physical check with a predetermined physical check specification;
 i. reporting a violation if the physical check step (a) determines that the result of the physical check exceeds a predetermined physical check specification; and
 j. substituting selected components with the corresponding logically equivalent component having a different drive strength to reduce the severity of the violation.

32. A method according to claim 31 wherein said physical check reporting step reports a violation if the capacitance on a route exceeds a maximum capacitance value.

33. A method according to claim 31 wherein said physical check reporting step reports a violation if the cross-talk between two routes exceeds a maximum cross-talk value.

34. A method according to claim 31 further comprising the step of recording a physical cell substitution list of the selected components that are substituted by said substitution step 31(j).

35. A method according to claim 34 further comprising the steps of recording an accumulated cell substitution list of the selected components that are substituted by said substitution step 31(j) during each of the number of iterations, storing a base cell substitution list of substituted components, and merging the accumulated cell substitution list of the selected components and the base cell substitution list of substituted components after each of the number of iterations.

36. A method according to claim 35 further comprising the step of merging the physical cell substitution list of selected components and the base cell substitution list of substituted components after the number of iterations have been completed, thereby resulting in a final cell substitution list.

37. A method according to claim 36 wherein said merging step of claim 36 further comprises the step of resolving any conflicts between the substituted components of the base cell substitution list and the selected components of the physical cell substitution list.

38. A method according to claim 37 further comprising the step of providing the final cell substitution list to a manual placement tool.

39. A method according to claim 37 wherein said resolving step resolves any conflicts using a predetermined priority scheme.

40. A method for optimizing the delay of a timing path in a circuit design, wherein the circuit design is represented in a circuit design database including a number of components selected from a component library, selected components of the component library having at least one corresponding logically equivalent component with a different drive strength, the timing path including a source latch, a destination latch, and a number of components connected therebetween, the method comprising the steps of:
 a. identifying the number of components that are in the timing path and the order thereof, extending from the source latch to the destination latch, including identifying a first one of the number of components;
 b. substituting the first one of the number of components with a corresponding logically equivalent component with a different drive strength;
 c. determining the delay of the timing path;
 d. substituting the first one of the number of components with a corresponding logically equivalent component with yet a different drive strength;
 e. determining the delay of the timing path and comparing the delay of the timing path with the delay determined in step (c);
 f. repeating steps (d) through (e) until an optimum delay is achieved;
 g. substituting the first one of the number of components with the corresponding logically equivalent component with the drive strength that produced the optimum delay of step (f);
 h. substituting a next one of the number of components with a corresponding logically equivalent component with a different drive strength;
 i. determining the delay of the timing path;
 j. substituting the next one of the number of components with a corresponding logically equivalent component with yet a different drive strength;
 k. determining the delay of the timing path and comparing the delay of the timing path with the delay determined in step (i);
 l. repeating steps (h) through (k) until an optimum delay is achieved;
 m. substituting the next one of the number of components with the corresponding logically equivalent component with the drive strength that produced the optimum delay of step (l); and
 n. repeating steps (h) through (m) for the remaining number of components identified by said identifying step (a) as being in the timing path.

41. A method according to claim 40 wherein the circuit design has a number of timing paths.

42. A method according to claim 41 wherein a particular component resides in a first timing path and a second timing path.

43. A method according to claim 42 wherein the substitution of the particular component optimizes the delay of the first timing path but does not optimize the delay of the second timing path, thereby causing a conflict.

44. A method according to claim 43 wherein the conflict is resolved by a priority scheme.

45. A method for reducing power consumption in a circuit design, wherein the circuit design is represented in a circuit design database including a number of components selected from a component library, selected components of the component library having at least one corresponding logically equivalent component with a different drive strength, the method comprising the steps of:

a. inputing the circuit design database into a data processing system, wherein the circuit design database includes a physical placement location of each component within the circuit design and routing information for routes between selected components within the circuit design;

b. extracting an RC file from the circuit design database wherein the RC file contains entries that represent the electrical load on selected components within the circuit design;

c. analyzing the delay of a number of timing paths within the circuit design by calculating the delay of selected components along each of the number of timing paths and summing the delays of the selected components;

d. comparing the delay of each timing path with a predefined specification;

e. reporting a power reduction indication if the delay along a selected timing path is determined to be below the predefined specification;

f. substituting selected components along selected timing paths with a corresponding logically equivalent component having a lower drive strength to improve the power consumption of the circuit design; and g. repeating steps (b) through (f) for a predetermined number of iterations.

* * * * *